US012596148B1

(12) United States Patent
Taub et al.

(10) Patent No.: US 12,596,148 B1
(45) Date of Patent: Apr. 7, 2026

(54) JITTER INJECTION GENERATOR FOR MEASURING PHASE NOISE AND JITTER TRANSFER FUNCTION

(71) Applicant: NVIDIA Corporation, Santa Clara, CA (US)

(72) Inventors: Benjamin Taub, Rosh Ha'Ayin (IL); Amit Nahmias, Kiryat Tivon (IL)

(73) Assignee: NVIDIA Corporation, Santa Clara, CA (US)

( * ) Notice: Subject to any disclaimer, the term of this patent is extended or adjusted under 35 U.S.C. 154(b) by 36 days.

(21) Appl. No.: 18/910,505

(22) Filed: Oct. 9, 2024

(51) Int. Cl.
G01R 31/317 (2006.01)

(52) U.S. Cl.
CPC . G01R 31/31709 (2013.01); G01R 31/31723 (2013.01); G01R 31/31727 (2013.01)

(58) Field of Classification Search
CPC ........ G01R 31/31709; G01R 31/31723; G01R 31/31727
See application file for complete search history.

(56) References Cited

U.S. PATENT DOCUMENTS 7,834,639 B2 * 11/2010 Ichiyama ............... H03K 5/156
702/69
9,423,441 B2 * 8/2016 Lee ........................ G01R 29/26

* cited by examiner

*Primary Examiner* — Vineeta S Panwalkar
(74) *Attorney, Agent, or Firm* — Lowenstein Sandler LLP

(57) ABSTRACT

Technologies for a jitter injection generator and a spectrum hardware engine for measuring and assessing phase noise and a jitter transfer function are described. One communication device includes a timing and synchronization circuit that generates a signal with time-domain data, and a spectrum hardware engine that converts this data into frequency-domain data. The spectrum hardware engine has registers storing past outputs, multipliers for computing products using these values and a pre-computed coefficient, and a summation block for combining the current input with these products to get the current output. This output is sent to a computing device to estimate phase noise.

22 Claims, 13 Drawing Sheets

Jitter Injection Generator

Jitter injection and spectrum measurement concept
For an example bidirectional link Jitter Injection Generator

500

```
┌─────────────────────────────────────────────────────────────┐
│  GENERATE, USING A TIMING AND SYNCHRONIZATION CIRCUIT OF A    │
│  COMMUNICATION DEVICE, A VICTIM SIGNAL  502                   │
└─────────────────────────────────────────────────────────────┘
                              ↓
┌─────────────────────────────────────────────────────────────┐
│  RECEIVE, USING A JITTER INJECTION GENERATOR, A FIRST SIGNAL  │
│  FROM A NOISE SOURCE CIRCUIT 504                              │
└─────────────────────────────────────────────────────────────┘
                              ↓
┌─────────────────────────────────────────────────────────────┐
│  GENERATE, USING THE JITTER INJECTION GENERATOR, A NEW VICTIM │
│  SIGNAL REPRESENTING THE VICTIM SIGNAL WITH INJECTED JITTER   │
│  BY 506                                                       │
└─────────────────────────────────────────────────────────────┘
                              ↓
┌─────────────────────────────────────────────────────────────┐
│  STORE A FIRST VALUE IN A FIRST REGISTER OF THE JITTER        │
│  INJECTION GENERATOR 508                                      │
└─────────────────────────────────────────────────────────────┘
                              ↓
┌─────────────────────────────────────────────────────────────┐
│  STORE A SECOND VALUE IN A SECOND REGISTER OF THE JITTER      │
│  INJECTION GENERATOR 510                                      │
└─────────────────────────────────────────────────────────────┘
                              ↓
┌─────────────────────────────────────────────────────────────┐
│  SELECT EITHER THE FIRST VALUE OR THE SECOND VALUE BASED ON   │
│  THE FIRST SIGNAL FROM THE NOISE SOURCE 512                   │
└─────────────────────────────────────────────────────────────┘
                              ↓
┌─────────────────────────────────────────────────────────────┐
│  ADD EITHER THE FIRST VALUE OR THE SECOND VALUE TO THE VICTIM │
│  SIGNAL TO OBTAIN THE NEW VICTIM SIGNAL 514                   │
└─────────────────────────────────────────────────────────────┘
```

FIG. 5

CALCULATE, USING A COMPUTING DEVICE, A PRE-COMPUTED COEFFICIENT
602

GENERATE, USING A TIMING AND SYNCHRONIZATION CIRCUIT OF A COMMUNICATION DEVICE, A SIGNAL COMPRISING AN INPUT SEQUENCE OF TIME-DOMAIN DATA 604

TRANSFORM, USING A SPECTRUM HARDWARE ENGINE OF THE COMMUNICATION DEVICE, THE TIME-DOMAIN DATA INTO FREQUENCY-DOMAIN DATA, BY 606

CALCULATE A FIRST PRODUCT OF A FIXED VALUE AND A SECOND VALUE, WHEREIN THE SECOND VALUE IS STORED IN A SECOND REGISTER OF THE SPECTRUM HARDWARE ENGINE AND REPRESENTS A SECOND PREVIOUS OUTPUT OF THE SPECTRUM HARDWARE ENGINE 608

CALCULATE A SECOND PRODUCT OF A FIRST VALUE AND THE PRE-COMPUTED COEFFICIENT, WHEREIN THE FIRST VALUE IS STORED IN A FIRST REGISTER OF THE SPECTRUM HARDWARE ENGINE AND REPRESENTS A FIRST PREVIOUS OUTPUT OF THE SPECTRUM HARDWARE ENGINE 610

SUM A THIRD VALUE, REPRESENTING A CURRENT INPUT OF THE TIME-DOMAIN DATA, THE FIRST PRODUCT, AND THE SECOND PRODUCT, TO OBTAIN A CURRENT OUTPUT 612

SEND THE CURRENT OUTPUT FOR THE FREQUENCY-DOMAIN DATA TO THE COMPUTING DEVICE 614

ESTIMATE, USING THE COMPUTING DEVICE, PHASE NOISE PRESENT IN THE SIGNAL USING AT LEAST THE FIRST PREVIOUS OUTPUT AND THE SECOND PREVIOUS OUTPUT 616

FIG. 6

JITTER INJECTION GENERATOR FOR MEASURING PHASE NOISE AND JITTER TRANSFER FUNCTION

RELATED APPLICATIONS

This application is related to co-pending U.S. application Ser. No. 18/910,502, filed concurrently.

TECHNICAL FIELD

At least one embodiment pertains to processing resources used to perform and facilitate network communication. For example, at least one embodiment pertains to measuring phase noise and jitter transfer function.

BACKGROUND

Communications systems transmit and receive signals at a high data rate (e.g., up to 200 Gbits/sec). High-speed transmissions exhibit significant noise attributes (e.g., due to the transmission medium) that require the use of communication devices (e.g., transmitters and receivers) configured to perform digital pre-processing by the transmitter device and post-processing by the receiver device.

SerDes (Serializer/Deserializer) is a communication interface that converts parallel data into serial data and vice versa. SerDes is widely used in high-speed data transmission applications such as optical fiber, Ethernet, PCI Express, HDMI, and USB. One of the key performance metrics of SerDes is the bit error rate (BER), which measures the probability of errors in the transmitted or received data. BER is directly affected by the phase noise or jitter of the SerDes components, such as the transmitter, the receiver, the phase-locked loop (PLL), and the clock and data recovery (CDR) circuit. Jitter is the deviation of the signal timing from its ideal position, which can cause data errors and degrade the signal quality. Phase noise is a frequency-domain view of the noise spectrum around the oscillator signal, while jitter is a time domain measure of the timing accuracy of the oscillator period. However, measuring jitter in SerDes is not a straightforward task, as there are several factors that complicate the process. The SerDes designer has to overcome these challenges by applying various techniques and optimizations, as well as using appropriate test equipment and methods.

BRIEF DESCRIPTION OF DRAWINGS

Various embodiments in accordance with the present disclosure will be described with reference to the drawings, in which:

FIG. 5 is a flow diagram of a method of generating a victim signal having jitter using a jitter injection generator according to at least one embodiment.

FIG. 6 is a flow diagram of a method of estimating phase noise in a signal using the spectrum hardware engine according to at least one embodiment.

DETAILED DESCRIPTION

Figure 1:
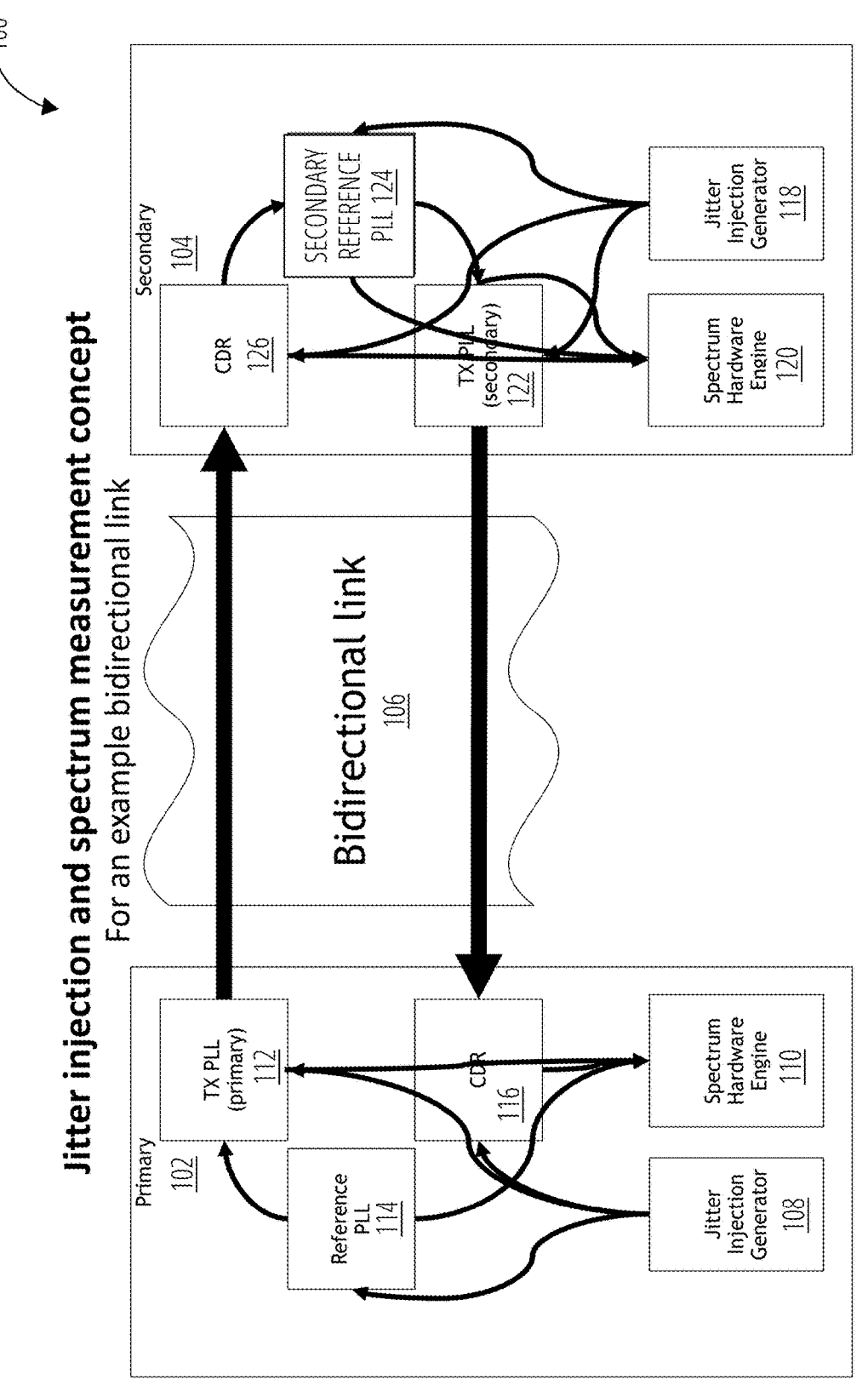
FIG. 1 is a block diagram of a system for jitter injection and spectrum measurement in two communication devices coupled via a bi-directional link according to at least one embodiment.

Technologies for a spectrum hardware engine for measuring phase noise and a jitter injection generator for measuring phase noise and a jitter transfer function are described. Phase noise is a frequency-domain view of the noise spectrum around the oscillator signal, while jitter is a time domain measure of the timing accuracy of the oscillator period. The following description sets forth numerous specific details, such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or presented in simple block diagram format to avoid obscuring the present disclosure unnecessarily. Thus, the specific details set forth are merely exemplary. Particular implementations may vary from these exemplary details and still be contemplated to be within the scope of the present disclosure.

As described above, measuring phase noise or jitter in SerDes is not a straightforward task, as there are several factors that complicate the process. For example, to measure the phase noise or jitter of the transmitter (TX), it is necessary to break the link between the transmitter and the receiver (RX), which disrupts the normal operation of the SerDes. This also requires a separate test equipment, such as an oscilloscope or a spectrum analyzer, to capture and analyze the signal. Also, the receiver of the SerDes usually employs a CDR circuit to recover the clock and data from the incoming serial signal. The CDR circuit also acts as a filter that attenuates the jitter components that are outside its bandwidth. Therefore, it is not possible to see the jitter that actually affects the receiver, as it is filtered by the CDR. Moreover, the CDR filter characteristics may vary depending on the operating conditions and the data pattern, which makes the jitter measurement more challenging.

The SerDes components, such as the PLL and the CDR, have their own jitter transfer functions, which determine how jitter is transferred between them. The jitter transfer functions depend on the loop bandwidth, the loop gain, the loop filter, and the feedback mechanism of the PLL and the CDR. The jitter transfer functions are also critically important, as they control how jitter is propagated through the SerDes, directly impacting the BER of the link. However, measuring the jitter transfer functions is not easy, as it requires a detailed knowledge of the SerDes architecture and parameters, as well as a sophisticated test setup.

Also, in bidirectional links (BiDi links), where two transmitters operate simultaneously on the same medium (e.g., fiber, copper, etc.), measuring phase noise or jitter is even more difficult, as the signals interfere with each other. This requires a special technique, such as coherent detection, to separate the signals and measure the jitter of each transmitter.

Mitigating jitter in SerDes is also a complex task, as it involves several trade-offs and optimizations. For example, the SerDes has a limited jitter budget, which is the maximum amount of jitter that can be tolerated by the system without exceeding the BER specification. The jitter budget is determined by the application, the data rate, the channel characteristics, and the receiver sensitivity. The SerDes designer has to allocate the jitter budget among the different sources of jitter, such as the transmitter, the receiver, the PLL, the CDR, the reference clock, and the channel. This requires a careful analysis and optimization of the jitter performance of each component, as well as the interaction between them.

The SerDes is subject to various sources of jitter, such as thermal noise, power supply noise, crosstalk, electromagnetic interference, and data-dependent jitter. The SerDes designer has to identify and quantify the jitter sources, and implement appropriate techniques to reduce or eliminate them. Some of the techniques include noise filtering, shielding, differential signaling, equalization, pre-emphasis, de-emphasis, and scrambling.

The SerDes receiver has to be able to tolerate a certain amount of jitter in the incoming signal, without compromising the data integrity. The jitter tolerance is a function of the CDR bandwidth, the CDR gain, the CDR filter, and the data pattern. The SerDes designer has to optimize the CDR parameters to achieve the desired jitter tolerance, while avoiding instability, overshoot, undershoot, and lock-in range issues.

The SerDes transmitter and receiver have to generate a minimum amount of jitter in the output signal, to avoid degrading the signal quality and the BER. The jitter generation is a function of the PLL bandwidth, the PLL gain, the PLL filter, the PLL feedback, and the data pattern. The SerDes designer has to optimize the PLL parameters to achieve the desired jitter generation, while avoiding phase noise, spurious tones, and harmonic distortion issues.

Aspects and embodiments of the present disclosure address these and other challenges by providing hardware circuits that can introduce and measure jitter in SerDes systems with minimal hardware overhead. As described herein, jitter is the variation of the timing of a signal from its ideal position, which can degrade the performance and reliability of high-speed serial links. By injecting and analyzing jitter at different points in the system, such as within each PLL, CDR, and the like, the hardware can be utilized to ascertain the frequency spectrum at different test points in the PLLs, CDRs, and the like; thereby determining the actual phase noise at those points. Subsequently, by combining jitter introduction and spectrum analysis, the jitter transfer functions across the system can be determined. The jitter transfer functions can be used to help identify and mitigate the sources of jitter and optimize the design and testing of SerDes systems.

Aspects and embodiments of the present disclosure can include a first hardware module, block, or device with a jitter injection generator and a second hardware module, block, or device with a spectrum hardware engine (also referred to as a hardware spectrum analyzer). The jitter injection generator can induce sinusoidal jitter with controllable amplitude and frequency at any point in the SerDes system, by modulating the phase of the signal with a simple 1-bit look-up table (LUT) that alternates between $-1$ and $+1$. Based on two stored LUT values, instead of just $+1/-1$, an amplitude and direct current (DC) offset can be controlled. The spectrum hardware engine can measure the phase noise of any signal in the system, by comparing its phase with a reference clock and computing the Discrete Fourier Transform (DFT) of the phase difference (colloquially referred to as Fast Fourier Transform (FFT)). In particular, a single bin of the DFT is what is being calculated. The spectrum analyzer does not require a large buffer to store the data for the DFT, as it uses an efficient sliding window algorithm that reduces the memory requirement to only two samples per frequency bin are stored within the spectrum measurement hardware. These hardware modules, blocks, or devices can be embedded on-chip, as it has minimal hardware overhead, and can communicate with an external controller via a serial interface.

Aspects and embodiments of the present disclosure can generate and inject jitter at various points throughout the system by using hardware, which is low-cost in area and power consumption, to oscillate various points in each of the PLLs and CDRs. In addition, similarly low cost hardware can be used to measure the frequency spectrum of the various test points in the PLLs and CDRs to measure effective phase noise at various points in the system. The jitter injections and spectrum measurement can be used together to enable the measurement of jitter transfer functions throughout the system. Aspects and embodiments of the present disclosure can use far less hardware than existing solutions. In particular, a large buffer is not required to store enough data for the DFT. Also, external lab equipment is not needed to measure the frequency response. Also, to generate periodic jitter, an 8-bit or 10-bit LUT is not needed to create a sinusoidal signal because the aspects and embodiments of the present disclosure can use two values in a LUT. These differences are what allows for the system to be embedded on chip, as the hardware is as minimal as possible (e.g., using only tens of bits worth of registers and logic gates). Aspects and embodiments of the present disclosure can utilize off-chip pre- and post-processing using external scripts.

FIG. 1 is a block diagram of a system 100 for jitter injection and spectrum measurement in two communication devices coupled via a bi-directional link according to at least one embodiment. The system 100 includes a primary communication device 102 coupled to a secondary communication device 104 via a bi-directional link 106. The primary communication device 102 includes a jitter injection generator 108, a spectrum hardware engine 110, a TX PLL 112, a reference PLL 114, and a CDR circuit 116. The secondary communication device 104 includes a jitter injection generator 118, a spectrum hardware engine 120, a TX PLL 122, a secondary reference PLL 124, and a CDR circuit 126, as described in more detail below.

The primary communication device 102 is equipped with a transmitter (TX) that utilizes the TX PLL 112 for precise frequency generation and signal stability. This TX PLL 112 can be synchronized with the reference PLL 114, which generates a high-precision clock signal that serves as a timing backbone for the transmitter (TX). The transmitter can send a clock signal embedded in a data stream being sent to the secondary communication device 104 over the bi-directional link 106. The reference PLL 114 ensures that the transmitter's clock signal is accurate and stable, allowing the primary communication device 102 to transmit data effectively at the desired frequency with minimal jitter or phase noise.

On the receiving end, the secondary communication device 104 includes a receiver (RX) with the CDR circuit 126, which is responsible for extracting the embedded clock signal from the incoming data stream from the primary communication device 102. This CDR circuit 126 works in tandem with a secondary reference PLL 124, which dynamically locks onto and tracks the recovered clock signal. The secondary reference PLL 124 ensures synchronization between the transmitted and received signals by continuously adjusting its frequency to match any variations in the transmitted signal. Together, the CDR circuit 126 and secondary reference PLL 124 enable the secondary communication device 104 to accurately interpret the transmitted data by maintaining synchronization with the primary device's transmitted clock and data signals.

Since the primary communication device 102 and secondary communication device 104 are coupled via the bi-directional link 106, the secondary communication device 104 includes the TX PLL 122 for precise frequency generation and signal stability for communications in the opposite direction. This TX PLL 122 can be synchronized with the secondary reference PLL 124, which is synchronized with the reference PLL 114. The transmitter of the secondary communication device 104 can send a clock signal embedded in a data stream being sent to the primary communication device 102 over the bi-directional link 106. The secondary reference PLL 124 ensures that the transmitter's clock signal is accurate and stable, allowing the secondary communication device 104 to transmit data effectively at the desired frequency with minimal jitter or phase noise. On the receiving end in the opposite direction, the secondary communication device 104 includes a receiver (RX) with the CDR circuit 116, which is responsible for extracting the embedded clock signal from the incoming data stream from the secondary communication device 104. The CDR circuit 116 enables the primary communication device 102 to accurately interpret the transmitted data by maintaining synchronization with the secondary device's transmitted clock and data signals.

The TX PLL 112, reference PLL 114, and CDR circuit 116 of the primary communication device 102 and the TX PLL 122, secondary reference PLL 124, and CDR circuit 126 of the secondary communication device 104 are example timing and synchronization circuits that generate signals that can be victims to an aggressor noise source. The jitter injection generator 108 can be coupled to any of the timing and synchronization circuits. In these embodiments, the jitter injection generator 108 is an intentional aggressor noise source that injects phase noise (also referred to herein as jitter) into the victim signal. The jitter injection generator 108 can include a noise generator circuit and a noise injection circuit. The noise injection circuit can receive a victim signal from a timing and synchronization circuit (i.e., a victim system) and the noise injection circuit can inject phase noise into the victim signal and provide a new victim signal back to the timing and synchronization circuit (victim system). The jitter injection generator 108 can induce sinusoidal jitter with controllable amplitude and frequency at any point in the SerDes system, by modulating the phase of the signal with a simple 1-bit look-up table (LUT) that alternates between −1 and +1. Based on two stored LUT values, instead of just +1/−1, an amplitude and DC offset can be controlled. The jitter injection generator 108 can be embedded on-chip, as it has minimal hardware overhead, and can communicate with an external controller via a serial interface. The jitter injection generator 108 includes minimal hardware to generate and inject phase noise into the victim signal, as described in more detail below with respect to FIG. 2.

As described above, the TX PLL 112, reference PLL 114, and CDR circuit 116 of the primary communication device 102 and the TX PLL 122, secondary reference PLL 124, and CDR circuit 126 of the secondary communication device 104 are example timing and synchronization circuits. Any one of these timing and synchronization circuits generates a signal with an input sequence of time-domain data. The spectrum hardware engine 110 can be coupled to any one of these timing and synchronization circuits. The spectrum hardware engine 110 can receive an input sequence of a signal from the timing and synchronization circuit and transform the time-domain data into frequency-domain data. The spectrum hardware engine 110 can measure the phase noise of any signal in the system, by comparing its phase with a reference clock and computing the DFT of the phase difference (colloquially referred to as FFT). In particular, a single bin of the DFT is what is being calculated. The spectrum hardware engine 110 does not require a large buffer to store the data for the DFT, as it uses an efficient sliding window algorithm that reduces the memory requirement to only two samples per frequency bin are stored within the spectrum measurement hardware. The spectrum hardware engine 110 can be embedded on-chip, as it has minimal hardware overhead, and can communicate with an external controller via a serial interface. The spectrum hardware engine 110 can estimate phase noise (jitter) present in the signal, as described in more detail below with respect to FIG. 3A.

Using the jitter injection generator 108 and the spectrum hardware engine 110, the system 100 can measure phase noise (jitter) and a jitter transfer function at any point in the communication device or across a unidirectional link or a bi-directional link between two communication devices. The jitter injection generator 108 is a hardware circuit that can introduce phase noise (jitter) in a SerDes system with minimal hardware overhead. The spectrum hardware engine 110 is a hardware circuit that can measure phase noise (or jitter) in the SerDes systems with minimal hardware overhead. By injecting and analyzing jitter at different points in the system, such as within each PLL or CDR, the hardware circuits (i.e., 108 and 110) can be utilized to ascertain the frequency spectrum at different test points in the PLLs and CDRs, thereby determining the actual phase noise at those points. Subsequently, by combining jitter introduction by the jitter injection generator 108 and the spectrum analysis by the spectrum hardware engine 110, a jitter transfer function across the system 100 can be determined. By measuring the phase noise (jitter) and/or the jitter transfer function, the sources of phase noise (jitter) can be identified and mitigated to optimize the design and testing of SerDes systems. Identification and mitigation of the phase noise sources can improve the performance and the reliability of high-speed serial links.

Figure 2:
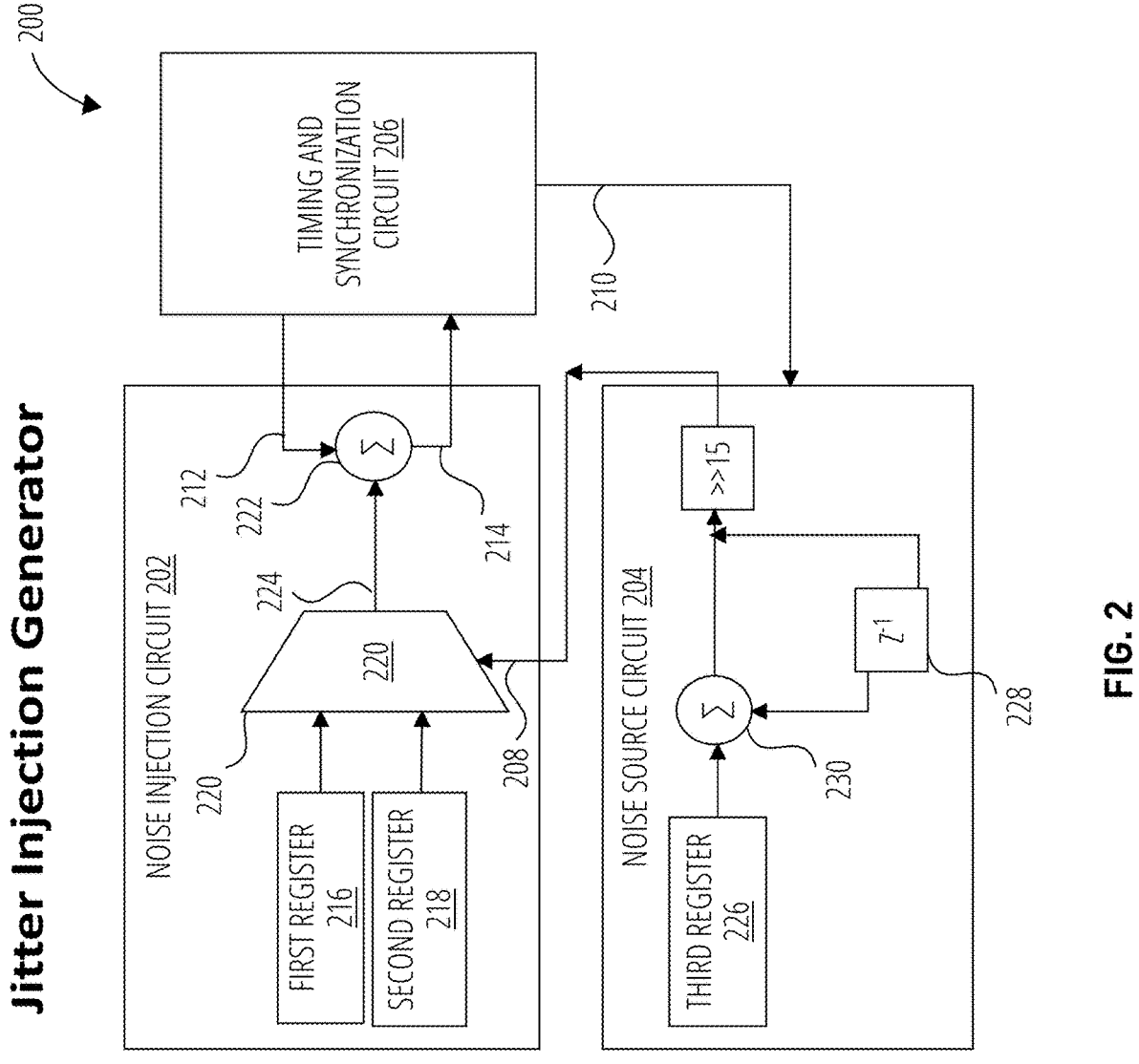
FIG. 2 is a block diagram of a jitter injection generator according to at least one embodiment.

FIG. 2 is a block diagram of a jitter injection generator 200 according to at least one embodiment. The jitter injection generator 200 includes a noise injection circuit 202 and a noise source circuit 204. The noise injection circuit 202 is coupled to a timing and synchronization circuit 206. As described above, the timing and synchronization circuit 206 can be any one of the TX PLL 112, reference PLL 114, and/or CDR circuit 116 of the primary communication device 102 of FIG. 1. The timing and synchronization circuit 206 can be any one of the TX PLL 122, secondary reference PLL 124, and/or CDR circuit 126 of the secondary communication device 104 of FIG. 1. In at least one embodiment, the jitter injection generator 200 can be the jitter injection generator 108 or the jitter injection generator 118 of FIG. 1.

In at least one embodiment, the noise source circuit 204 is a numerically controlled oscillator (NCO) that generates a signal 208 for the noise injection circuit 202. In at least one embodiment, the NCO can receive a clock signal 210 from the timing and synchronization circuit 206. The timing and synchronization circuit 206 is a victim system that generates a victim signal 212. The noise injection circuit 202 can use the signal 208 to generate phase noise to be added to the victim signal 212 to obtain a new victim signal 214. The new victim signal 214 represents the victim signal 212 with injected jitter (phase noise). The noise injection circuit 202 can provide the new victim signal 214 back to the timing and synchronization circuit 206.

In at least one embodiment, the noise injection circuit 202 includes a first register 216 to store a first value (i.e., first programmable value) and a second register 218 to store a second value. The noise injection circuit 202 includes a multiplexer 220 coupled to the first register and the second register. The multiplexer 220 can be controlled by the signal 208 received from the noise source circuit 204. The multiplexer 220 can select either the first value from the first register 216 or the second value from the second register 218. A summation block 222 (e.g., an adder) is coupled to an output of the multiplexer 220. The summation block 222 can receive the victim signal 212 and an output signal 224 from the multiplexer to obtain the new victim signal 214. As described above, the multiplexer 220 can select either the first value or the second value based on the signal 208 from the noise source circuit 204. In at least one embodiment, the noise injection circuit 202 is implemented in hardware as two registers, a multiplexer, and an adder (summation block).

In at least one embodiment, the noise source circuit 204 is a numerically controlled oscillator (NCO). In at least one embodiment, the timing and synchronization circuit 206 can provide the clock signal 210 to the NCO. In at least one embodiment, the NCO includes a third register 226 to store an initial value, a fourth register 228 to store a current value, and an adder 230 (e.g., summation block) coupled to the third register 226 and the fourth register 228. The adder 230 can add the initial value to the current value to obtain a new current value to be stored in the fourth register 228. The fourth register 228 can be an accumulator register. The NCO can provide a most significant bit of the current value, stored in the fourth register 228, in the signal 208 after each clock cycle of the clock signal 210. In at least one embodiment, the NCO is a periodic noise source. In at least one embodiment, the NCO can be implemented in hardware as a 16-bit adder and two 16-bit registers, including the third register 226 (storing the initial value) and the fourth register 228 (storing the accumulated value). In other embodiments, other periodic or non-periodic noise source circuits can be used, such as a random noise generator (RNG) circuit. In at least one embodiment, the noise source circuit 204 is an RNG circuit that generates a pseudorandom binary sequence (PRBS). That is, the signal 208 provided to the noise injection circuit 202 can include a PRBS. In at least one embodiment, the RNG circuit includes a third register and a set of exclusive OR (XOR) gates coupled to the third register. The third register can be a 31-bit register. The 31-bit register and the set of XOR gates can provide a PRBS of length 31 (PRBS31). The PRBS can be used to control the multiplexer 220 to generate the output signal 224. In particular, the PRBS selects the first value stored in the first register 216 or the second value stored in the second register 218.

The jitter injection generator 200 can be implemented with minimal hardware, such as 3 or 4 registers, a couple of adders, and a multiplexer or XOR gates.

Figure 3A:
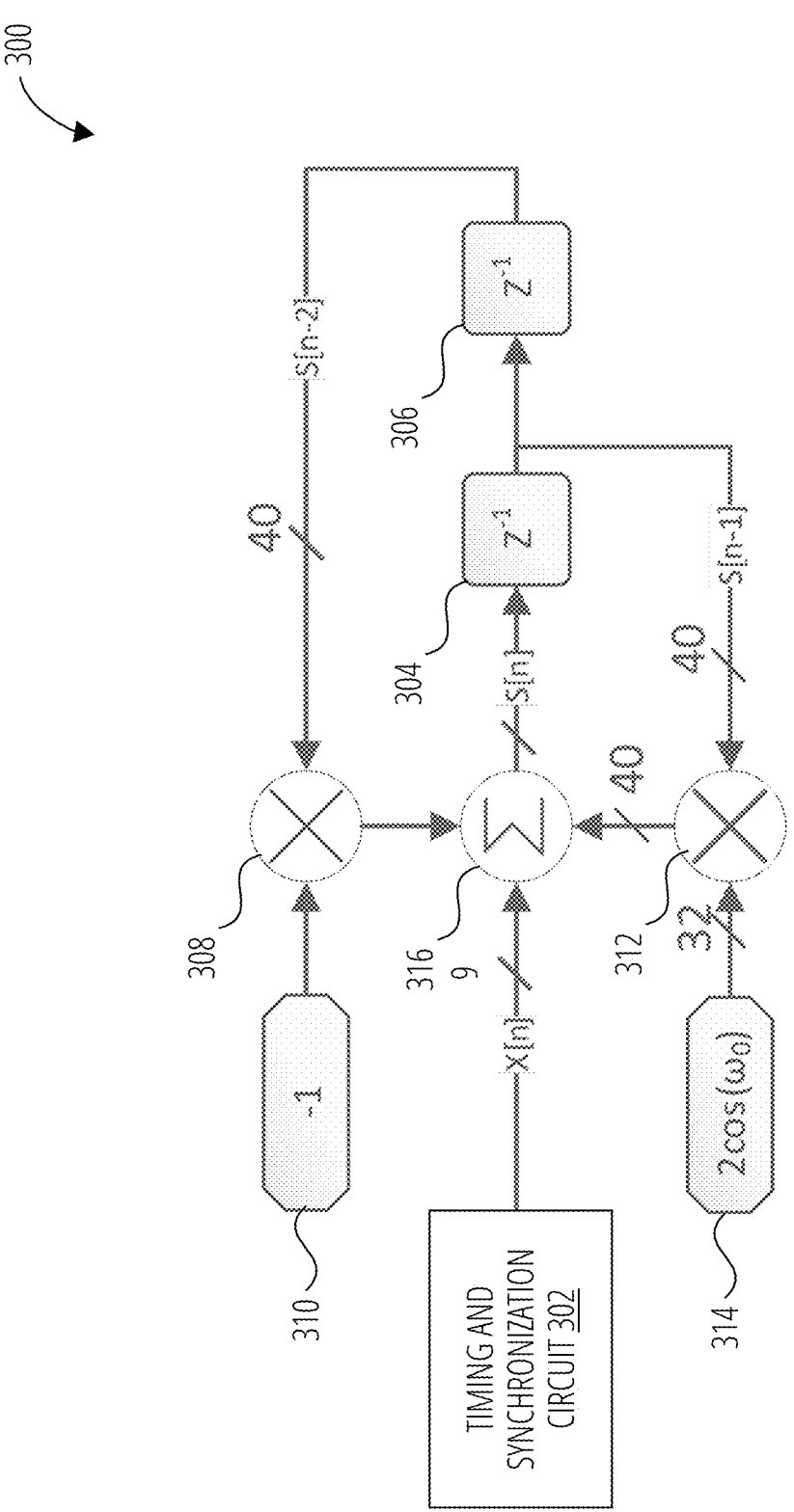
FIG. 3A is a flow diagram of spectrum hardware engine according to at least one embodiment.

FIG. 3A is a flow diagram of spectrum hardware engine 300 according to at least one embodiment. The spectrum hardware engine 300 can be coupled to a timing and synchronization circuit 302. The timing and synchronization circuit 302 can be any one of the TX PLL 112, reference PLL 114, and/or CDR circuit 116 of the primary communication device 102 of FIG. 1. The timing and synchronization circuit 302 can be any one of the TX PLL 122, secondary reference PLL 124, and/or CDR circuit 126 of the secondary communication device 104 of FIG. 1. In at least one embodiment, the spectrum hardware engine 300 is the spectrum hardware engine 110 or the spectrum hardware engine 120 of FIG. 1.

In at least one embodiment, the spectrum hardware engine 300 includes a first register 304 to store a first value representing a first previous output (also referred to as a first result) of the spectrum hardware engine 300 and a second register 306 to store a second value representing a second previous output (also referred to as a second result) of the spectrum hardware engine 300. The spectrum hardware engine 300 includes a first multiplier 308 to calculate a first product of the second value and a fixed value 310. The spectrum hardware engine 300 includes a second multiplier 312 to calculate a second product of the first value and a pre-computed coefficient 314. The pre-computed coefficient 314 can be calculated by a computing device operatively coupled to the communication device. The spectrum hardware engine 300 includes a summation block 316 to sum a third value, representing a current input of the time-domain data, the first product, and the second product, to obtain a current output. The spectrum hardware engine 300 can send the current output for the frequency-domain data to the computing device. The computing device can estimate phase noise present in the signal using at least the first previous output and the second previous output, stored in the first register 304 and the second register 306, respectively. The computing device can estimate frequencies or frequency components in the signal contributed by phase noise or jitter.

In at least one embodiment, the first register 304 and the second register 306 each include 40 bits, the third value includes 9 bits, and the pre-computed coefficient 314 is 32 bits. In other embodiments, other number of bits can be used for the first register 304, the second register 306, the third value, and the pre-computed coefficient 314.

In at least one embodiment, a communication device includes a timing and synchronization circuit to generate a signal comprising an input sequence of time-domain data. The spectrum hardware engine 110 is coupled to the timing and synchronization circuit, and includes memory to store two output values and calculation logic. The calculation logic can receive the input sequence from the timing and synchronization circuit and a pre-computed coefficient from a computing device operatively coupled to the communication device. The calculation logic can transform the time-domain data into frequency-domain data using at least the input sequence and the pre-computed coefficient. The spectrum hardware engine can output the two output values to the computing device. The computing device to estimate phase noise present in the signal using at least the two output values.

Figures 3B, 3C, 3D:
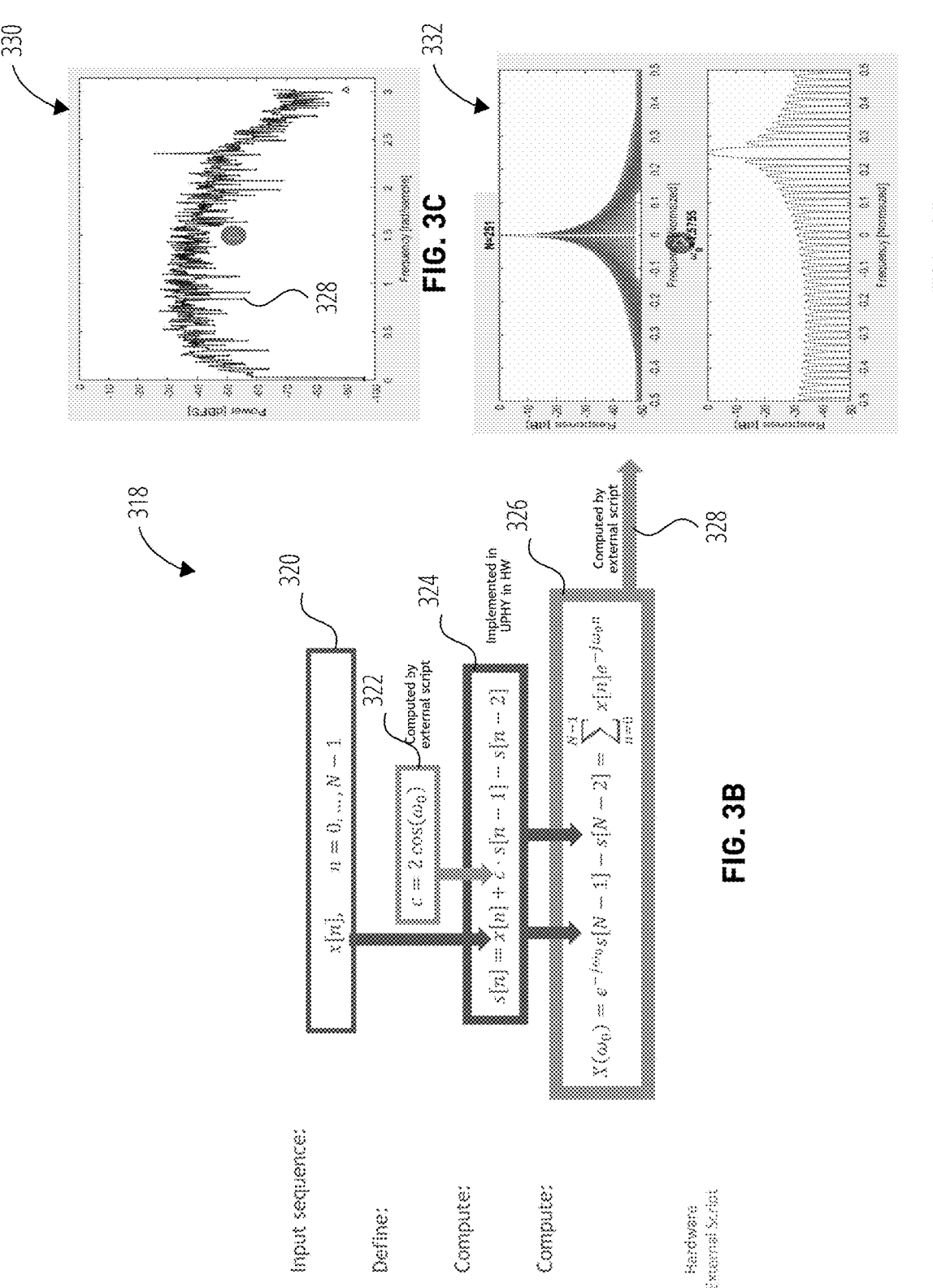
FIG. 3B is flow diagram of a process of compute operations for computing frequency-domain data using the spectrum hardware engine of FIG. 3A and an external script according to at least one embodiment.
FIG. 3C is a graph illustrating the frequency-domain data generated by the process of FIG. 3B according to at least one embodiment.
FIG. 3D is a graph illustrating a normalized frequency response of the frequency response of FIG. 3C according to at least one embodiment.

FIG. 3B is flow diagram of a process 318 of compute operations for computing frequency-domain data using the spectrum hardware engine 300 of FIG. 3A and an external script according to at least one embodiment. The spectrum hardware engine 300 receives an input sequence 320 (e.g., x[n], n=0, . . . , N−1, and a pre-computed coefficient computed in a first compute operation 322. The compute operation 322 can be performed by an external script. The external script can be executed by a computing device operatively coupled to a communication device with the spectrum hardware engine 300. The input sequence 320 can include time-domain data. The spectrum hardware engine 300 can compute values of an output signal in a second compute operation 324 (e.g., s[n]=x[n]+c*s[n−1]−s[n−2]). The spectrum hardware engine 300 can compute and store two output values (e.g., s[n−1] and s[n−2]) that are used by a subsequent compute operation 326. The compute operation 326 is performed by the external script. The spectrum hardware engine 300 can be implemented in the hardware of a physical (PHY) layer of a communication interface (e.g., a communication interface that implements the UPHY protocol). The external script can be implemented in a computing device operatively coupled to the communication interface.

FIG. 3C is a graph 330 illustrating the frequency-domain data 328 generated by the process 318 of FIG. 3B according to at least one embodiment. The graph 330 is a frequency response graph in terms of radians per sample (rad/sample). Rad/sample is a unit of angular frequency (ω) used to express the frequency of a signal in discrete-time systems, particularly when analyzing signals in the digital domain. The angular frequency (ω) is the rate of change of the phase of a signal, expressed in radians per second in continuous-time systems because time is quantized into discrete samples. The angular frequency in rad/sample is related to the sampling frequency ($f_s$) of a digital system. A full cycle in radians is 271, which corresponds to the Nyquist frequency ($f_s/2$) in digital systems. Frequencies range from 0 to $\pi$ rad/sample for positive frequencies, where: 0 rad/sample represents DC (zero frequency), and $\pi$ rad/sample corresponds to the Nyquist frequency. The values in units can be converted to frequency in Hertz using the following Equation 1:

$$f(\text{Hz}) = \frac{\varpi(\text{rad/sample})x f_s(\text{samples/second})}{2\pi},$$

where $f_s$ is the sampling rate in samples per second.

The frequency-domain data 328 can be normalized to a frequency response in Hertz, as illustrated in FIG. 3D.

FIG. 3D is a graph 332 illustrating a normalized frequency response of the frequency response of FIG. 3C according to at least one embodiment.

Figures 4A, 4B:
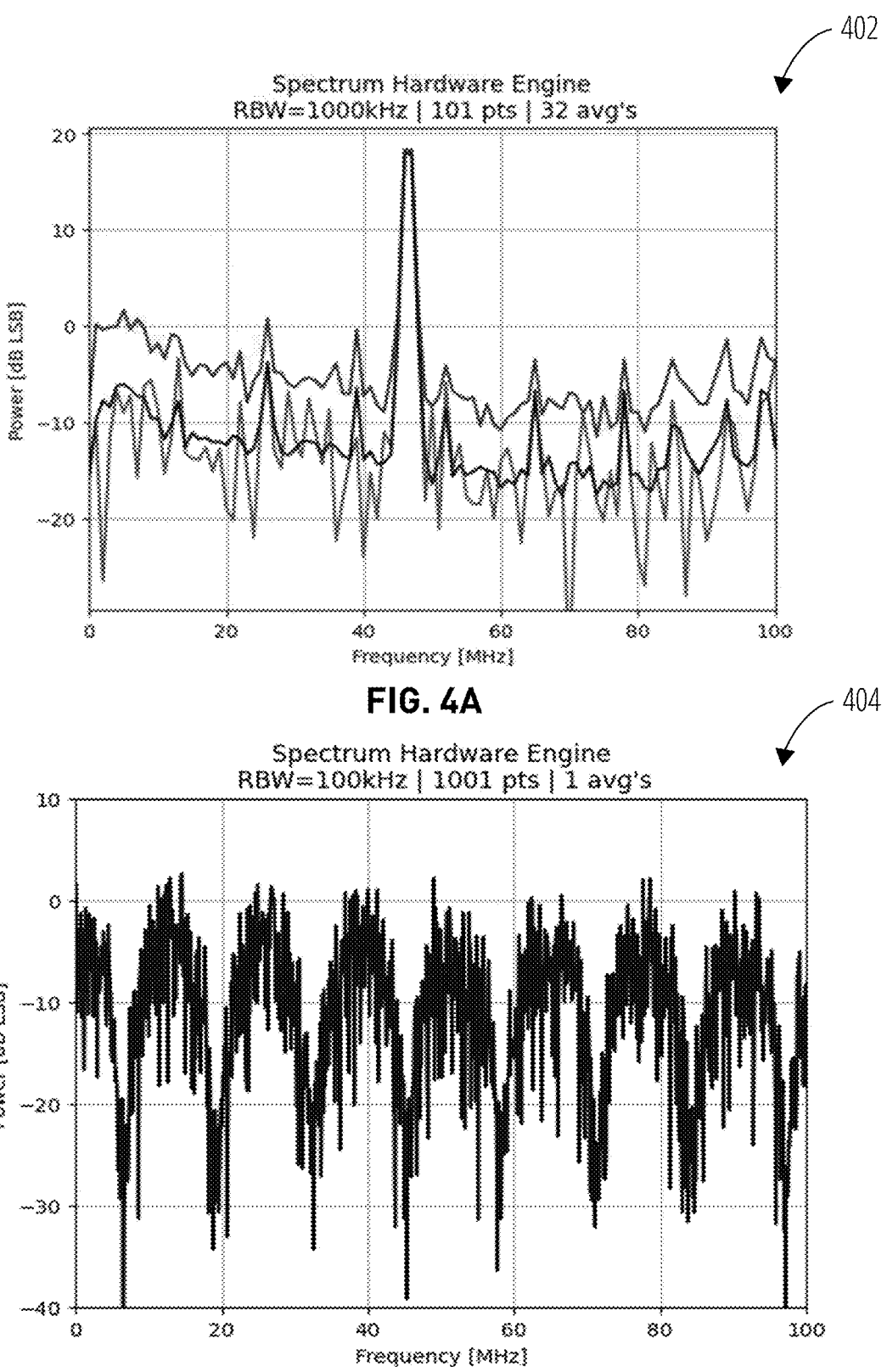
FIG. 4A is a graph of a frequency response measured by the spectrum hardware engine according to at least one embodiment.
FIG. 4B is a graph of a frequency response measured by the spectrum hardware engine according to at least one embodiment.

FIG. 4A is a graph 402 of a frequency response measured by the spectrum hardware engine according to at least one embodiment. The graph 402 shows a max-hold and average trace in addition to the measurements.

FIG. 4B is a graph 404 of a frequency response measured by the spectrum hardware engine according to at least one embodiment.

FIG. 5 is a flow diagram of a method 500 of generating a victim signal having jitter using a jitter injection generator according to at least one embodiment. The method 500 can be performed by processing logic comprising hardware, software, firmware, or any combination thereof. In at least one embodiment, the method 500 is performed by the primary communication device 102 or secondary communication device 104 of FIG. 1. The method 500 can be performed by the jitter injection generator 200 of FIG. 2. In at least one embodiment, the method 500 is performed by any of the devices described herein.

Referring to FIG. 5, the method 500 begins with the processing logic generating, using a timing and synchronization circuit of a communication device, a victim signal (block 502). At block 504, the processing logic receives, using a jitter injection generator, a first signal from a noise source circuit. At block 506, the processing logic generates, using the jitter injection generator, a new victim signal representing the victim signal with injected jitter by. At block 508, the processing logic stores a first value in a first register of the jitter injection generator. At block 510, the processing logic stores a second value in a second register of the jitter injection generator. At block 512, the processing logic selects either the first value or the second value based on the first signal from the noise source circuit. At block 514, the processing logic adds either the first value or the second value to the victim signal to obtain the new victim signal.

FIG. 6 is a flow diagram of a method 600 of estimating phase noise in a signal using the spectrum hardware engine according to at least one embodiment. The method 600 can be performed by processing logic comprising hardware, software, firmware, or any combination thereof. In at least one embodiment, the method 600 is performed by the primary communication device 102 or secondary communication device 104 of FIG. 1. The method 600 can be performed by spectrum hardware engine 300 of FIG. 3A. In at least one embodiment, the method 600 is performed by any of the devices described herein.

Referring to FIG. 6, the method 600 begins with the processing logic calculating, using a computing device, a pre-computed coefficient (block 602). At block 604, the processing logic generates, using a timing and synchronization circuit of a communication device, a signal including an input sequence of time-domain data. In at least one embodiment, the timing and synchronization circuit is a PLL or a CDR circuit of a communication device or communication interface. At block 606, the processing logic transforms, using a spectrum hardware engine of the communication device, the time-domain data into frequency-domain data, by calculating a first product of a fixed value (e.g., negative one (−1)) and a second value (block 608), calculating a second product of a first value and the pre-computed coefficient (block 610), and summing a third value, representing a current input of the time-domain data, the first product, and the second product, to obtain a current output (block 612). The second value is stored in a second register of the spectrum hardware engine 300 and represents a second previous output of the spectrum hardware engine 300. The first value is stored in a first register of the spectrum hardware engine 300 and represents a first previous output of the spectrum hardware engine. At block 614, the processing logic sends the current output for the frequency-domain data to the computing device. At block 616, the processing logic estimates, using the computing device, phase noise present in the signal using at least the first previous output and the second previous output.

In at least one embodiment, the method 500 and method 600 can be performed in the same communication device. In another embodiment, the method 500 and 600 can be performed in separate communication devices coupled via a unidirectional link or a bi-directional link. For example, after performing the operation at block 514 of FIG. 5, the processing logic can generate, using the timing and synchronization circuit, a second signal comprising an input sequence of time-domain data, the second signal being subject to the injected jitter. The processing logic can transform, using a spectrum hardware engine of the communication device, the time-domain data into frequency-domain data, by calculating a first product of a fixed value and a second value, calculating a second product of a first value and a pre-computed coefficient computed by a computing device operatively coupled to the communication device, and summing a third value, representing a current input of the time-domain data, the first product, and the second product, to obtain a current output. The second value is stored in a second register of the spectrum hardware engine 300 and represents a second previous output of the spectrum hardware engine 300. The first value is stored in a first register of the spectrum hardware engine 300 and represents a first previous output of the spectrum hardware engine 300. The processing logic sends the current output for the frequency-domain data to the computing device. The processing logic can estimate, using the computing device, phase noise present in the second signal using at least the first previous output and the second previous output. In a further embodiment, the processing logic measures a jitter transfer function using the injected jitter and the phase noise present in the second signal.

In at least one embodiment, the processing logic estimates the phase noise present in the signal using a spectral analysis and frequency estimation algorithm. The spectral analysis and frequency estimation algorithm is the Goertzel algorithm. In at least one embodiment, the processing logic estimates the phase noise by calculating a normalized frequency using sampling rate and a target frequency, calculating the pre-computed coefficient and a second coefficient using the normalized frequency, calculating real and imaginary parts of a detected frequency component, and calculating a magnitude squared of the detected frequency component.

Figure 7:
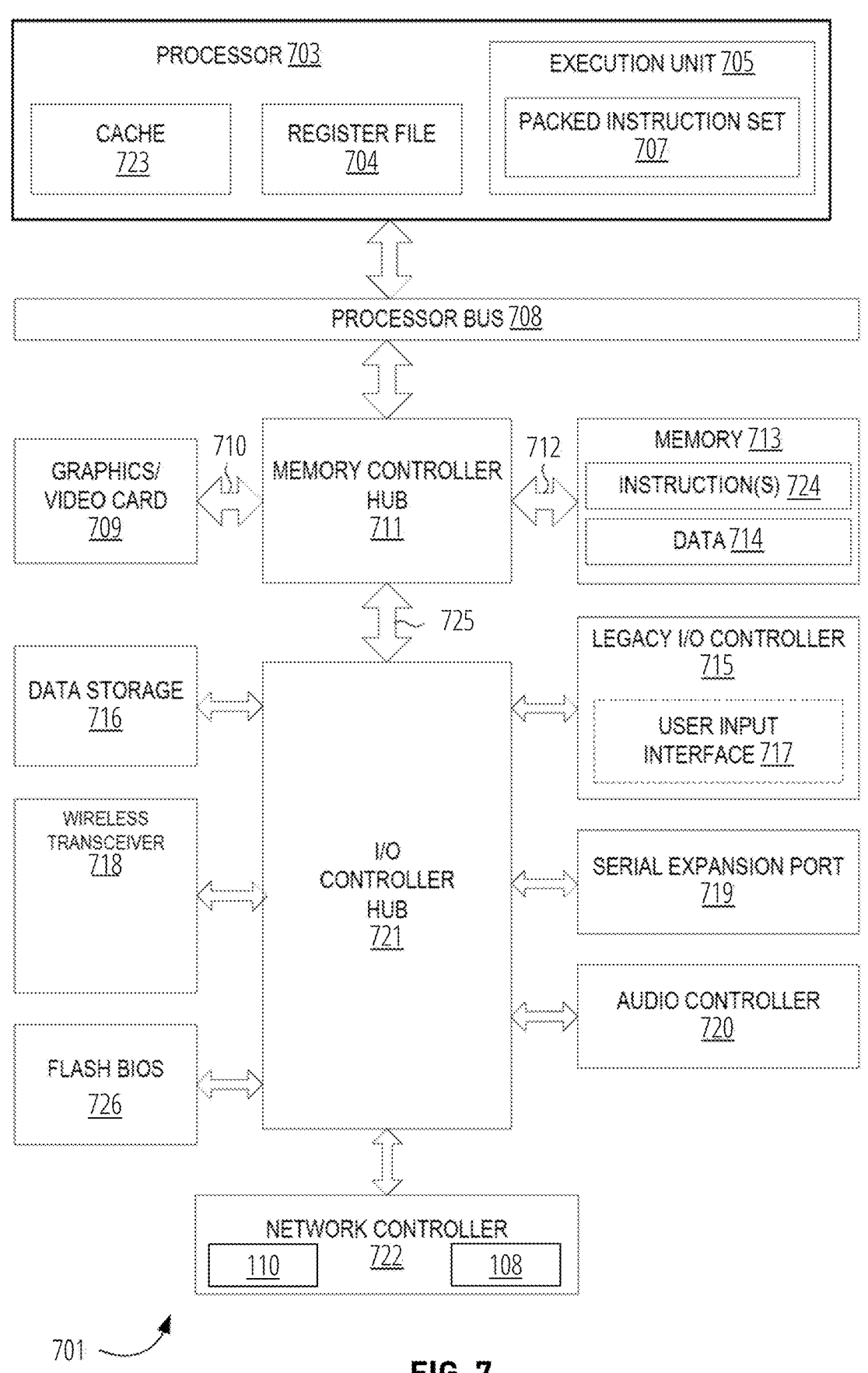
FIG. 7 illustrates an example computer system including a spectrum hardware engine and a jitter injection generator according to at least one embodiment.

FIG. 7 illustrates an example computer system 701, including a jitter injection generator 108 and a spectrum hardware engine 110, in accordance with at least some embodiments. In at least one embodiment, computer system 701 may be a system with interconnected devices and components, an SOC, or some combination. In at least one embodiment, computer system 701 is formed with a processor 703 that may include execution units to execute an instruction. In at least one embodiment, computer system 701 may include, without limitation, a component, such as a processor 703, to employ execution units including logic to perform algorithms for processing data. In at least one embodiment, computer system 701 may include processors, such as PENTIUM® Processor family, Xeon™, Itanium®, XScale™ and/or StrongARM™, Intel® Core™, or Intel® Nervana™ microprocessors available from Intel Corporation of Santa Clara, California, although other systems (including PCs having other microprocessors, engineering workstations, set-top boxes and like) may also be used. In at least one embodiment, computer system 701 may execute a version of WINDOWS' operating system available from Microsoft Corporation of Redmond, Wash., although other operating systems (UNIX and Linux, for example), embedded software, and/or graphical user interfaces, may also be used.

In at least one embodiment, computer system 701 may be used in other devices such as handheld devices and embedded applications. Some examples of handheld devices include cellular phones, Internet Protocol devices, digital cameras, personal digital assistants ("PDAs"), and handheld PCs. In at least one embodiment, embedded applications may include a microcontroller, a digital signal processor (DSP), an SoC, network computers ("NetPCs"), set-top boxes, network hubs, wide area network ("WAN") switches, or any other system that may perform one or more instructions. In an embodiment, computer system 701 may be used in devices such as graphics processing units (GPUs), network adapters, central processing units, and network devices such as switches (e.g., a high-speed direct GPU-to-GPU interconnect such as the NVIDIA GH100 NVLINK or the NVIDIA Quantum 2 64 Ports InfiniBand NDR Switch).

In at least one embodiment, computer system 701 may include, without limitation, processor 703 that may include, without limitation, one or more execution units 705 that may be configured to execute a Compute Unified Device Architecture ("CUDA") (CUDA® is developed by NVIDIA Corporation of Santa Clara, CA) program. In at least one embodiment, a CUDA program is at least a portion of a software application written in a CUDA programming language. In at least one embodiment, computer system 701 is a single processor desktop or server system. In at least one embodiment, computer system 701 may be a multiprocessor system. In at least one embodiment, processor 703 may include, without limitation, a CISC microprocessor, a RISC microprocessor, a VLIW microprocessor, and a processor implementing a combination of instruction sets, or any other processor device, such as a digital signal processor, for example. In at least one embodiment, processor 703 may be coupled to a processor bus 708 that may transmit data signals between processor 703 and other components in computer system 701.

In at least one embodiment, processor 703 may include, without limitation, a Level 1 ("L1") internal cache memory ("cache") 723. In at least one embodiment, processor 703 may have a single internal cache or multiple levels of internal cache. In at least one embodiment, cache memory may reside external to processor 703. In at least one embodiment, processor 703 may also include a combination of both internal and external caches. In at least one embodiment, a register file 704 may store different types of data in various registers including, without limitation, integer registers, floating point registers, status registers, and instruction pointer register.

In at least one embodiment, execution unit 705, including, without limitation, logic to perform integer and floating point operations, also resides in processor 703. Processor 703 may also include a microcode ("ucode") read only memory ("ROM") that stores microcode for certain macro instructions. In at least one embodiment, execution unit 705 may include logic to handle a packed instruction set 707. In at least one embodiment, by including packed instruction set 707 in an instruction set of a general-purpose processor 703, along with associated circuitry to execute instructions, operations used by many multimedia applications may be performed using packed data in a general-purpose processor 703. In at least one embodiment, many multimedia applications may be accelerated and executed more efficiently by using full width of a processor's data bus for performing operations on packed data, which may eliminate a need to transfer smaller units of data across a processor's data bus to perform one or more operations one data element at a time.

In at least one embodiment, execution unit 706 may also be used in microcontrollers, embedded processors, graphics devices, DSPs, and other types of logic circuits. In at least one embodiment, computer system 701 may include, without limitation, a memory 713. In at least one embodiment, memory 713 may be implemented as a DRAM device, an SRAM device, flash memory device, or other memory devices. Memory 713 may store instruction(s) 724 and/or data 714 represented by data signals that may be executed by processor 703.

In at least one embodiment, a system logic chip may be coupled to a processor bus 708 and memory 713. In at least one embodiment, the system logic chip may include, without limitation, a memory controller hub ("MCH") 711, and processor 703 may communicate with MCH 711 via processor bus 708. In at least one embodiment, MCH 711 may provide a high bandwidth memory path 712 to memory 713 for instruction and data storage and for storage of graphics commands, data, and textures. In at least one embodiment, MCH 711 may direct data signals between processor 703, memory 713, and other components in computer system 701 and may bridge data signals between processor bus 708, memory 713, and a system I/O 725. In at least one embodiment, a system logic chip may provide a graphics port for coupling to a graphics controller. In at least one embodiment, MCH 711 may be coupled to memory 713 through high bandwidth memory path 712, and graphics/video card 709 may be coupled to MCH 711 through an Accelerated Graphics Port ("AGP") interconnect 710.

In at least one embodiment, computer system 701 may use system I/O 725 that is a proprietary hub interface bus to couple MCH 711 to I/O controller hub ("ICH") 721. In at least one embodiment, ICH 721 may provide direct connections to some I/O devices via a local I/O bus. In at least one embodiment, a local I/O bus may include, without limitation, a high-speed I/O bus for connecting peripherals to memory 713, a chipset, and processor 703. Examples may include, without limitation, an audio controller 720, a firmware hub ("flash BIOS") 726, a wireless transceiver 718, a data storage 716, a legacy I/O controller 715 containing a user input interface 717, a keyboard interface, a serial expansion port 719, such as a USB, and a network controller 722. In at least one embodiment, the network controller 722 includes the jitter injection generator 108, the spectrum hardware engine 110, or both as described herein. Data storage 716 may comprise a hard disk drive, a floppy disk drive, a CD-ROM device, a flash memory device, or other mass storage device.

In at least one embodiment, FIG. 7 illustrates a system, which includes interconnected hardware devices or "chips." In at least one embodiment, FIG. 7 may illustrate an example SoC. In at least one embodiment, devices illustrated in FIG. 7 may be interconnected with proprietary interconnects, standardized interconnects (e.g., PCIe), or some combination thereof. In at least one embodiment, one or more components of system 702 are interconnected using compute express link ("CXL") interconnects.

Figure 8A:
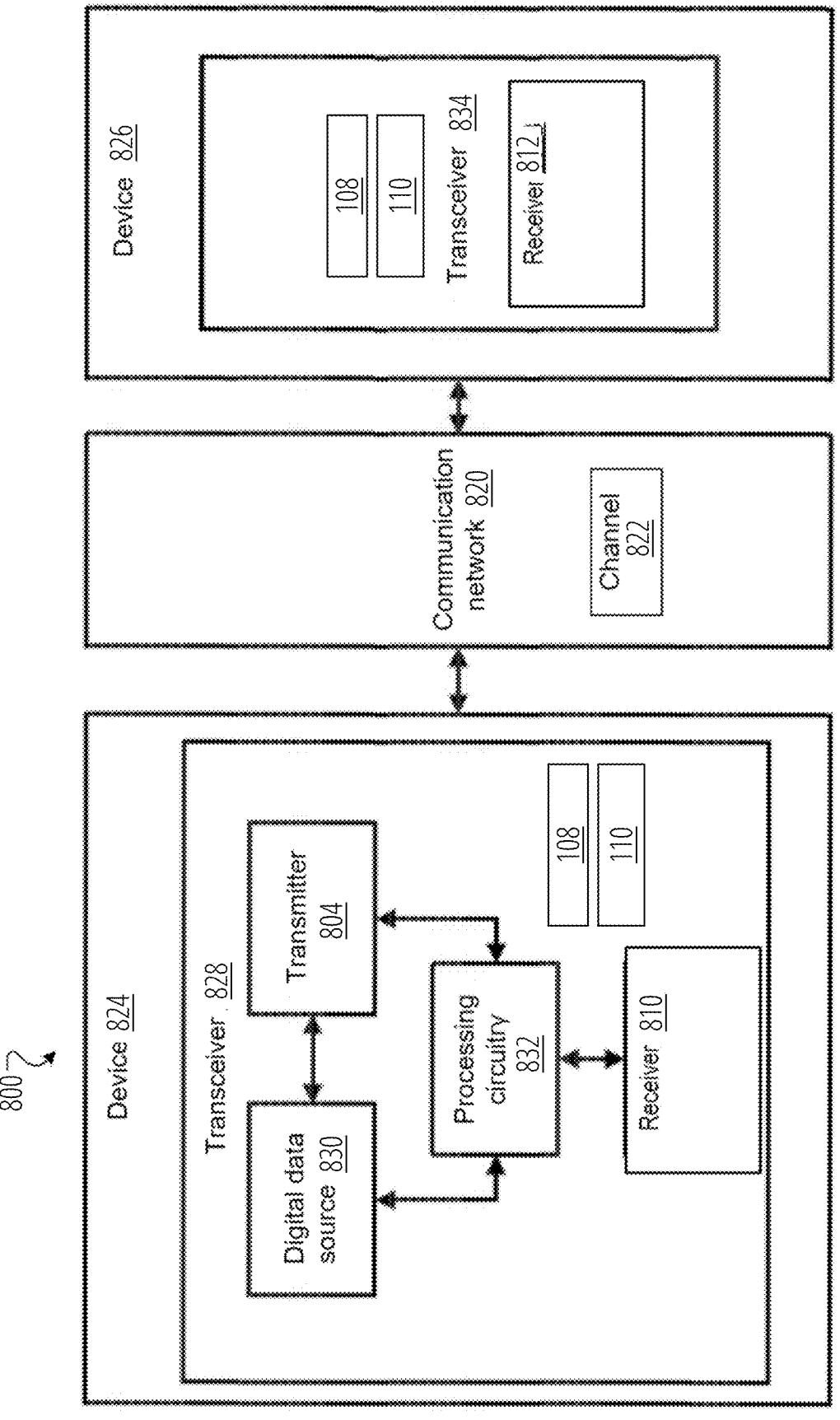
FIG. 8A illustrates an example communication system with a jitter injection generator and a spectrum hardware engine, in accordance with at least some embodiments.

FIG. 8A illustrates an example communication system 800 with a jitter injection generator 108 and a spectrum hardware engine 110, in accordance with at least some embodiments. The system 800 includes a device 824, a communication network 820 including a communication channel 822, and a device 826. In at least one example embodiment, devices 824 and 826 correspond to one or more of a Personal Computer (PC), a laptop, a tablet, a smartphone, a server, a collection of servers, or the like. In some embodiments, the devices 824 and 826 may correspond to any appropriate type of device that communicates with other devices also connected to a common type of communication network 820. According to embodiments, the receiver 810, 812 of devices 824 or 826 may correspond to a graphics processing unit (GPU), a switch (e.g., a high-speed network switch), a network adapter, a central processing unit (CPU), a data processing unit (DPU), etc. As another specific but non-limiting example, the devices 824 and 826 may correspond to servers offering information resources, services and/or applications to user devices, client devices, or other hosts in the system 800.

Examples of the communication network 820 that may be used to connect the devices 824 and 826 include an Internet Protocol (IP) network, an Ethernet network, an InfiniBand (IB) network, a Fibre Channel network, the Internet, a cellular communication network, a wireless communication network, combinations thereof (e.g., Fibre Channel over Ethernet), variants thereof, and/or the like. In other embodiments, the communication network 820 can be a Peripheral Component Interconnect Express (PCIe) interconnect. PCIe is a high-speed interface standard used to connect various hardware components. It can be an interconnect for devices such as graphics cards (GPUs), solid-state drives (SSDs), network cards, and other peripherals. PCIe offers a scalable, high-speed, and point-to-point connection between devices, including CPUs, GPUs, memory, and the like. In other embodiments, the communication network 820 can be a high-speed interconnect, such as an interconnect that deploys the NVLink technology. The NVLink interconnect can be a GPU-GPU interconnect used between GPUs, a CPU-GPU interconnect between GPUs and CPUs, or an interconnect used between other devices. NVLink offers a higher bandwidth and lower latency than traditional PCIe connections, which are typically used in computing hardware. NVLink is especially useful in scenarios that require massive parallel processing, such as artificial intelligence (AI), machine learning, deep learning, high-performance computing (HPC), and data analytics. For example, in NVIDIA's DGX systems and high-end gaming or AI workstations, NVLink helps GPUs exchange data at speeds that are necessary for demanding tasks like real-time ray tracing or training neural networks. In one specific, but non-limiting example, the communication network 820 is a network that enables data transmission between the devices 824 and 826 using data signals (e.g., digital, optical, wireless signals). The embodiments described herein can be utilized in a system with a high-speed, scalable switch, such as a switch using the NVSwitch technology. NVSwitch is a high-speed, scalable switch developed by NVIDIA that facilitates data communication between multiple GPUs in a system, allowing them to work together more efficiently by providing high-bandwidth, low-latency interconnections. The NVSwitch serves as a central hub or high-bandwidth fabric that interconnects all the GPUs in a system, enabling each GPU to communicate with every other GPU quickly and efficiently. The NVSwitch can be coupled between other types of devices, such as CPUs, accelerators, memory, or the like. The NVSwitch can be used for tasks requiring intense computation and collaboration between multiple GPUs, such as AI model training, scientific simulations, and large-scale data processing. The embodiments described herein can be used in a high-performance computing system, such as a computing system modeled after NVIDIA's DGX systems, which are designed specifically for artificial intelligence (AI), deep learning, and high-performance computing (HPC) workloads. DGX systems are optimized for large-scale GPU computation and parallel processing, integrating multiple GPUs, high-bandwidth interconnects, and software frameworks tailored for AI and HPC tasks. In at least one embodiment, a system for high-speed network communication includes a processing unit, a network interface comprising a communication device with the spectrum hardware engine 110, the jitter injection generator 108, or both, as described herein. The processing unit can include a CPU, a GPU, a DPU, a network adapter, a network switch, an NVLink switch, or the like.

The device 824 includes a transceiver 828 for sending and receiving signals, for example, data signals. The data signals may be digital or optical signals modulated with data or other suitable signals for carrying data.

The transceiver 828 may include a digital data source 830, a transmitter 804, a receiver 810, and processing circuitry 832 that controls the transceiver 828. The digital data source 830 may include suitable hardware and/or software for outputting data in a digital format (e.g., in binary code and/or thermometer code). The digital data output by the digital data source 830 may be retrieved from memory (not illustrated) or generated according to input (e.g., user input).

The transmitter 804 includes suitable software and/or hardware for receiving digital data from the digital data source 830 and outputting data signals according to the digital data for transmission over the communication network 820 to a receiver 812 of device 826. In at least one embodiment, the transmitter 804 includes a jitter injection generator 108 and a spectrum hardware engine 110.

The receiver 810, 812 of device 824 and device 826 may include suitable hardware and/or software for receiving signals, for example, data signals from the communication network 820. For example, the receivers 810, 812 may include components for receiving processing signals to extract the data for storing in a memory. In at least one embodiment, the receiver 812 includes a jitter injection generator 108 and a spectrum hardware engine 110. In another embodiment, the receiver 810 also includes jitter injection generator 108 and a spectrum hardware engine 110. The receiver 812 receives an incoming signal and samples the incoming signal to generate samples, such as using an analog-to-digital converter (ADC). The ADC can be controlled by a clock-recovery circuit (or clock recovery block) in a closed-loop tracking scheme. The clock-recovery circuit can include a phase detector (or a TED) that can measure a phase offset of the samples. The phase offset is also referred to as a sampling offset. The clock-recovery circuit can include a controlled oscillator, such as a voltage-controlled oscillator (VCO) or a digitally-controlled oscillator (DCO) that controls the sampling of the subsequent data by the ADC. The clock-recovery circuit can use other closed-loop tracking schemes to determine a sampling offset or phase offset. Additional details of the jitter injection generator 108 and a spectrum hardware engine 110 are discussed in more detail above with reference to the figures.

The processing circuitry 832 may comprise software, hardware, or a combination thereof. For example, the processing circuitry 832 may include a memory including executable instructions and a processor (e.g., a microprocessor) that executes the instructions on the memory. The memory may correspond to any suitable type of memory device or collection of memory devices configured to store instructions. Non-limiting examples of suitable memory devices that may be used include Flash memory, Random Access Memory (RAM), Read Only Memory (ROM), variants thereof, combinations thereof, or the like. In some embodiments, the memory and processor may be integrated into a common device (e.g., a microprocessor may include integrated memory). Additionally or alternatively, the processing circuitry 832 may comprise hardware, such as an application specific integrated circuit (ASIC). Other non-limiting examples of the processing circuitry 832 include an Integrated Circuit (IC) chip, a CPU, A GPU, a DPU, a microprocessor, a Field Programmable Gate Array (FPGA), a collection of logic gates or transistors, resistors, capacitors, inductors, diodes, or the like. Some or all of the processing circuitry 832 may be provided on a Printed Circuit Board (PCB) or collection of PCBs. It should be appreciated that any appropriate type of electrical component or collection of electrical components may be suitable for inclusion in the processing circuitry 832. The processing circuitry 832 may send and/or receive signals to and/or from other elements of the transceiver 828 to control the overall operation of the transceiver 828.

The transceiver 828 or selected elements of the transceiver 828 may take the form of a pluggable card or controller for the device 824. For example, the transceiver 828 or selected elements of the transceiver 828 may be implemented on a network interface card (NIC).

The device 826 may include a transceiver 834 for sending and receiving signals, for example, data signals over a channel 822 of the communication network 820. The channel 822 can be PCIe, NVLink, Ethernet, InfiniBand, Ground Reference Signal (GRS), Chip-to-Chip (C2C), Die-to-Die (D2D), or the like. The same or similar structure of the transceiver 828 may be applied to transceiver 834, and thus, the structure of transceiver 834 is not described separately.

Although not explicitly shown, it should be appreciated that devices 824 and 826 and the transceivers 828 and 834 may include other processing devices, storage devices, and/or communication interfaces generally associated with computing tasks, such as sending and receiving data.

Figure 8B:
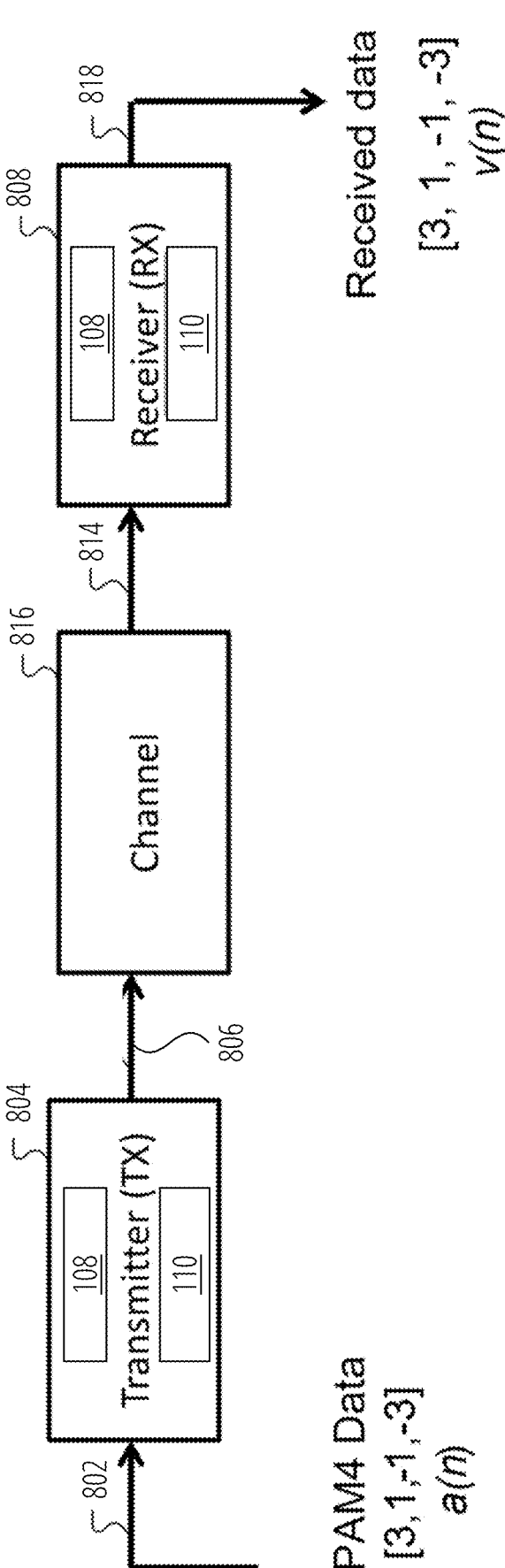
FIG. 8B illustrates a block diagram of an example communication system employing a jitter injection generator and a spectrum hardware engine, according to at least one embodiment.

FIG. 8B illustrates a block diagram of an example communication system 840 employing a jitter injection generator 108 and a spectrum hardware engine 110, according to at least one embodiment. In the example shown in FIG. 8B, a PAM level-4 (PAM4) modulation scheme is employed with respect to the transmission of a signal (e.g., digitally encoded data) from a transmitter (TX) 804 to a receiver (RX) 808 via a communication channel 816 (e.g., a transmission medium). The communication channel 816 can be PCIe, NVLink, Ethernet, InfiniBand, GRS, C2C, D2D, or the like. In this example, the transmitter 804 receives 802 an input data (i.e., the input data at time n is represented as "a(n)"), which is modulated in accordance with a modulation scheme (e.g., PAM4) and sends 806 the signal a(n) including a set of data symbols (e.g., symbols −3, −1, 1, 3, wherein the symbols represent coded binary data). It is noted that while the use of the PAM4 modulation scheme is described herein by way of example, other data modulation schemes can be used in accordance with embodiments of the present disclosure, including for example, a non-return-tozero (NRZ) modulation scheme, PAM3, PAM7, PAM8, PAM16, etc. For example, for an NRZ-based system, the transmitted data symbols consist of symbols –1 and 1, with each symbol value representing a binary bit. This is also known as a PAM level-2 or PAM2 system as there are 2 unique values of transmitted symbols. Typically, a binary bit 0 is encoded as –1, and a bit 1 is encoded as 1 as the PAM2 values.

In the example shown, the PAM4 modulation scheme uses four (4) unique values of transmitted symbols to achieve higher efficiency and performance. The four levels are denoted by symbol values –3, –1, 1, 3, with each symbol representing a corresponding unique combination of binary bits (e.g., 00, 01, 10, 11).

The communication channel 816 is a destructive medium in that the channel acts as a low pass filter which attenuates higher frequencies more than it attenuates lower frequencies, introduces inter-symbol interference (ISI) and noise from cross talk, from power supplies, from Electromagnetic Interference (EMI), or from other sources. The communication channel 816 can be over serial links (e.g., a cable, printed circuit boards (PCBs) traces, copper cables, optical fibers, or the like), read channels for data storage (e.g., hard disk, flash solid-state drives (SSDs), high-speed serial links, deep space satellite communication channels, applications, or the like.

As described above, in some communication systems, the transmitter 804 sends the signal 806 as a data signal without a transmitter clock used to generate the data signal. The receiver (RX) 104 receives an incoming signal 814 over the communication channel 816. The incoming signal 814 can be degraded and attenuated by the communication channel 816 and include noise. The incoming signal 814 can be affected by the transmitter clock jitter. The jitter injection generator 108 can generate and inject jitter in a victim signal. The spectrum hardware engine 110 can measure and evaluate a frequency response to determine phase noise and jitter transfer functions, as described herein.

Figure 9:
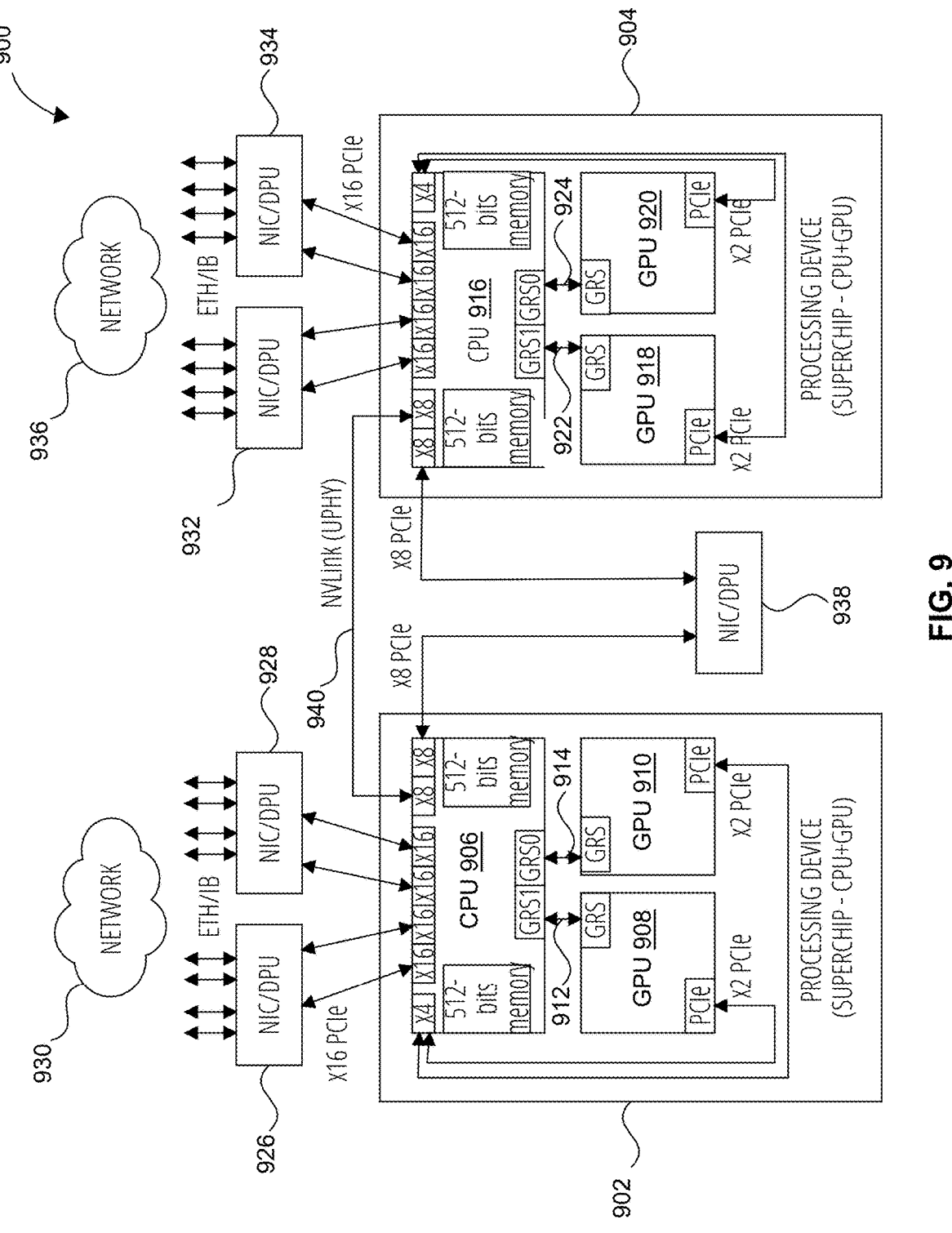
FIG. 9 is a block diagram of a computing system having two processing devices coupled to each other and multiple networks according to at least one embodiment.

FIG. 9 is a block diagram of a computing system 900 having two processing devices coupled to each other and multiple networks according to at least one embodiment. The computing system 900 is designed with multiple integrated circuits (referred to as processing devices), where each integrated circuit includes a CPU and two GPUs, forming a powerful and flexible architecture. These processing devices are interconnected via an NVLink (or other high-speed interconnect), enabling high-speed communication between the processing devices, and are also connected through a Network Interface Card (NIC) or Data Processing Unit (DPU) to ensure efficient data transfer across the computing system 900. The coupling of processing devices through NVLink allows for seamless data exchange and parallel processing, enhancing overall computational performance. Additionally, these processing devices are connected to multiple networks through one or more network interface cards (NICs) or DPUs, enabling the system to handle complex, multi-network tasks with high bandwidth and low latency. This configuration makes the computing system 900 highly suitable for demanding applications that require significant processing power, such as artificial intelligence (AI), machine learning (ML), and data-intensive computing, while ensuring robust connectivity and scalability across various networked environments. The integrated circuits of the computing system 900 can include one or more CPUs and one or more GPUs. An example architecture of a multi-GPU architecture is illustrated in FIG. 9.

As illustrated in FIG. 9, the computing system 900 includes a processing device 902 with a multi-GPU architecture. In particular, the processing device 902 includes a CPU 906, a GPU 908, and a GPU 910. The CPU 906 can be coupled to the GPU 908 via an die-to-die (D2D) or chip-to-chip (C2C) interconnect 912, such as a Ground-Referenced Signaling interconnect (GRS interconnect). The CPU 906 can be coupled to the GPU 910 via a D2D or C2C interconnect 914. The CPU 906 can also couple to the GPU 908 and GPU 910 via PCIe interconnects. The CPU 906 can be coupled to one or more network interface cards (NICs) or data processing units (DPUs), which are coupled to one or more networks. For example, as illustrated in FIG. 9, the CPU 906 is coupled to a first NIC/DPU 926, which is coupled to a network 930. The CPU 906 is also coupled to a second NIC/DPU 928, which is coupled to the network 930. The NIC/DPU 926 and NIC/DPU 928 can be coupled to the network 930 over Ethernet (ETH) or InfiniBand (IB) connections.

The computing system 900 also includes a processing device 904 with a multi-GPU architecture. In particular, the processing device 904 includes a CPU 916, a GPU 918, and a GPU 920. The CPU 916 can be coupled to the GPU 918 via an D2D or C2C interconnect 922. The CPU 916 can be coupled to the GPU 920 via a D2D or C2C interconnect 924. The CPU 916 can also couple to the GPU 918 and GPU 920 via PCIe interconnects. The CPU 916 can be coupled to one or more NICs or DPUs, which are coupled to one or more networks. For example, as illustrated in FIG. 9, the CPU 916 is coupled to a first NIC/DPU 932, which is coupled to a network 936. The CPU 916 is also coupled to a second NIC/DPU 934, which is coupled to the network 936. The NIC/DPU 932 and NIC/DPU 934 can be coupled to the network 936 over Ethernet (ETH) or InfiniBand (IB) connections.

In at least one embodiment, the processing device 902 and the processing device 904 can communicate with each other via a NIC/DPU 938, such as over PCIe interconnects. The processing device 902 and processing device 904 can also communicate with each other over a high-bandwidth communication interconnects 940, such as an NVLink interconnect or other high-speed interconnects.

The computing system 900 includes various types of interconnects. Each of the interconnects can include a jitter injection generator 108, a spectrum hardware engine 110, or both. The details of the jitter injection generator 108 and the spectrum hardware engine 110 are described above.

Figure 10:
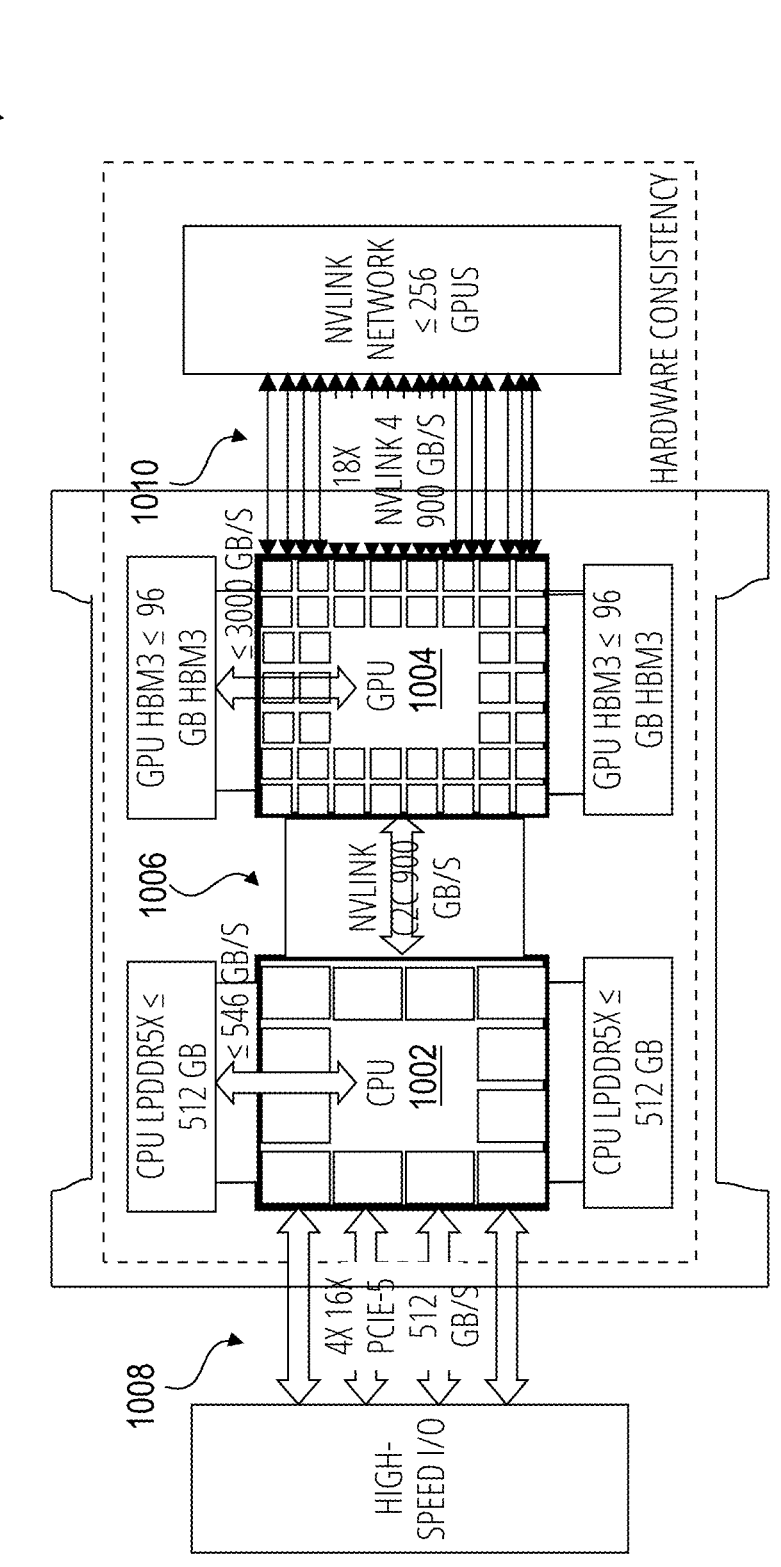
FIG. 10 is a block diagram of a computing system having a central processing unit (CPU) and a graphics processing unit (GPU) in a single integrated circuit according to at least one embodiment.

FIG. 10 is a block diagram of a computing system 1000 having a CPU 1002 and a GPU 1004 in a single integrated circuit according to at least one embodiment. The computing system 1000 can be a highly integrated design where a CPU 1002 and GPU 1004 are connected on a single integrated circuit, utilizing an NVLink C2C (Chip-to-Chip) interconnect 1006 to enable fast, low-latency communication between the two processing units. This close integration allows for efficient data transfer and parallel processing between the CPU 1002 and GPU 1004, optimizing performance for complex computational tasks. The GPU elements within the computing system 1000 can be interconnected using an NVLink network, allowing for scalability up to 256 GPU elements, creating a powerful, unified processing environment ideal for large-scale AI, ML, and high-performance computing applications. The NVLink network can be a GPU fabric of high-bandwidth communication interconnects 1010. Additionally, the computing system 1000 can be designed to interface with a high-speed I/O through PCIe interconnects 1008, ensuring rapid data transfer to and from external devices, further enhancing the system's capabilities in handling data-intensive tasks and providing robust connectivity to peripheral components. It should be noted that the C2C interconnects 1006 can be considered D2D interconnects since the CPU 1002 and the GPU 1004 are located on the same integrated circuit. The integrated circuit can include CPU memory (also referred to as main memory) and GPU memory, which are accessible by the CPU 1002 and the GPU 1004, respectively, over high-speed interconnects. The computing system 1000 can bring together performance of the GPU 1004 with the versatility of the CPU 1002. The CPU 1002 can be connected with a high-bandwidth and memory coherent C2C interconnects 1006 in a single integrated circuit. The computing system 1000 can support a link switch system.

The computing system 1000 includes various types of interconnects. Each of the interconnects can include a jitter injection generator 108, a spectrum hardware engine 110, or both. The details of the jitter injection generator 108 and the spectrum hardware engine 110 are described above. Aspects and embodiments of the present disclosure can introduce and measure jitter (phase noise) in SerDes systems with minimal hardware overhead. Jitter is the variation of the timing of a signal from its ideal position, which can degrade the performance and reliability of high-speed serial links. By injecting and analyzing jitter at different points in the system, the jitter transfer functions can be evaluated, which describe how jitter propagates from one component to another. This can help identify and mitigate the sources of jitter and optimize the design and testing of SerDes systems. The jitter injection generator 108 can induce sinusoidal jitter with controllable amplitude and frequency at any point in the SerDes system, by modulating the phase of the signal with a simple 1-bit LUT that alternates between −1 and +1. The spectrum hardware engine 110 can measure the phase noise of any signal in the system, by comparing its phase with a reference clock and computing the DFT of the phase difference. The spectrum hardware engine 110 does not require a large buffer to store the data for the FFT, as it uses an efficient sliding window algorithm that reduces the memory requirement to only one sample per frequency bin. The jitter injection generator 108 and spectrum hardware engine 110 can be embedded on-chip, as it has minimal hardware overhead, and can communicate with an external controller via a serial interface.

Figure 11:
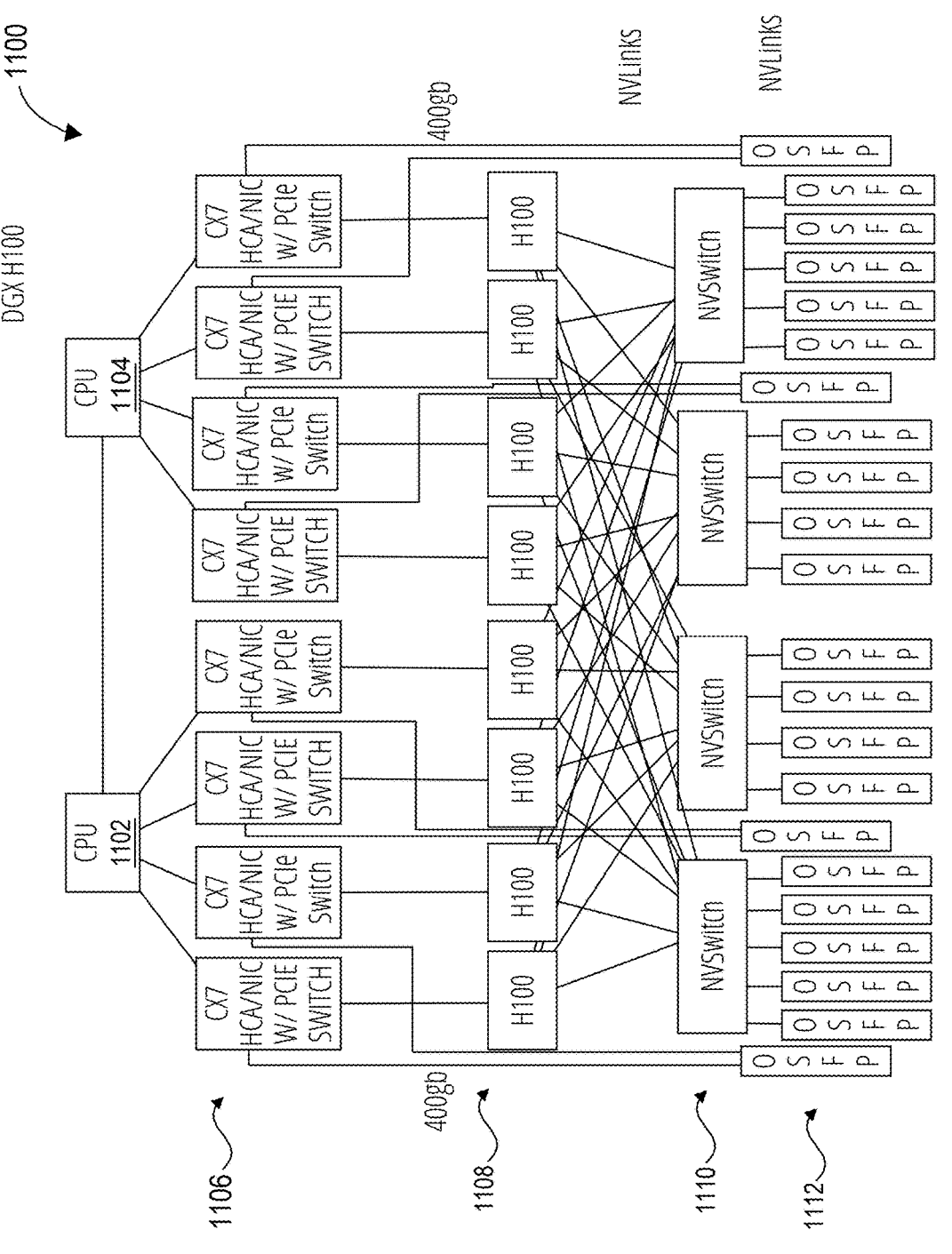
FIG. 11 is a block diagram of a computing system having tensor core graphics processing units (GPUs) according to at least one embodiment.

FIG. 11 is a block diagram of a computing system 1100 having tensor core GPUs 1108 according to at least one embodiment. The computing system 1100 can be a DGX H100 system, which is a high-performance computing platform designed to meet the demands of AI, ML, and deep learning (DL) workloads. The computing system 1100 can include multiple tensor core GPUs 1108 (e.g., NVIDIA H100 Tensor Core GPUs). The tensor core GPUs 1108 can each be one of the integrated circuits described above with respect to FIG. 10. The tensor core GPUs 1108 can be optimized for AI/ML/DL applications, offering exceptional performance for deep learning training, inference, and high-performance computing tasks. The tensor core GPUs 1108 within the computing system 1100 are interconnected using high-speed communication interfaces like NVLinks, enabling rapid data transfer between them, which is crucial for handling large-scale AI models and datasets with low latency. This computing system 1100 is designed for scalability, allowing for the integration of additional GPUs as required, making it versatile enough for research, development, and deployment in data centers for production AI workloads. Each GPU is equipped with Tensor Cores, specialized processing units that accelerate matrix operations, a fundamental component of AI and deep learning algorithms. These Tensor Cores enable the system to perform mixed-precision calculations efficiently, balancing speed and accuracy. Given the power consumption and heat generation of multiple tensor core GPUs 1108, the computing system 1100 can include advanced cooling solutions and power management features to ensure safe operation while maintaining peak performance. It is supported by a comprehensive software ecosystem, including NVIDIA's CUDA programming model, AI frameworks like TensorFlow and PyTorch, and other HPC and AI software tools, which enable developers and researchers to harness the full power of the tensor core GPUs 1108 for their specific applications. The computing system 1100 is ideally suited for large-scale AI model training, real-time inference, scientific simulations, data analytics, and other compute-intensive tasks that require massive parallel processing power.

The tensor core GPUs 1108 can be coupled to multiple CPUs, such as CPU 1102 and CPU 1104, using switches 1106 (e.g., CX7 HCA/NIC with PCIe switch). The tensor core GPUs 1108 can be coupled to each other via switches 1110 (e.g., NVSwitches). The switches 1106 and switches 1110 can be coupled to high-speed transceiver modules 1112. The high-speed transceiver modules 1112 can be Octal Small Form-factor Pluggable (OSFP) modules. OSFP modules refer to high-speed transceiver modules designed for rapid data communication, particularly in environments requiring significant bandwidth, such as data centers and high-performance computing systems. These modules support extremely high data rates, typically up to 400 Gbps per module, with future capabilities extending to 800 Gbps or more. OSFP modules interface with the system via the PCIe interface, enabling fast and efficient data transfer between the integrated CPU-GPU components and external networks or other connected systems. Their hot-pluggable nature allows for easy insertion or removal without the need to power down the system, offering flexibility and ease of maintenance, which is crucial in critical-uptime environments. Additionally, OSFP modules are designed for high density, maximizing the number of high-speed connections within limited space, such as in densely packed server racks. By adhering to the latest networking standards, OSFP modules ensure the computing system 1100 remains capable of meeting increasing data demands and can be upgraded to support future advancements in network speeds, thus contributing to the system's overall performance and scalability.

In at least one embodiment, the computing system 1100 can be considered a data-network configuration with full-bandwidth intra-server NVLinks. In this example, all eight tensor core GPUs 1108 can simultaneously saturate eighteen NVLinks to other GPUs within the server. The bandwidth is limited by over-subscription from multiple other GPUs. In another embodiment, data-network configuration can be a half-bandwidth intra-server NVLinks. In this example, all eight tensor core GPUs 1108 can half-subscribe eighteen NVLinks to GPUs in other servers. Four tensor core GPUs 1108 can saturate eighteen NVLinks to GPUs in other servers. This is equivalent of full-bandwidth on AllReduce with Scalable Hierarchical Aggregation and Reduction Protocol (SHARP). The reduction in all-2-all (All2All) bandwidth is a balance with server complexity and costs. In at least one embodiment, all eight tensor core GPUs 1108 can independently transfer data, using Remote Direct Memory Access (RDMA) protocol, over its own dedicated switch (e.g., 400 Gb/s HCA/NIC) in a multi-rail InfiniBand/Ethernet configuration. In this example, 800 GBps of aggregate full-duplex to non-NVLink network devices.

The computing system 1100 includes various types of interconnects. Each of the interconnects can include a jitter injection generator 108, a spectrum hardware engine 110, or both. The details of the jitter injection generator 108 and the spectrum hardware engine 110 are described above.

Other variations are within spirit of present disclosure. Thus, while disclosed techniques are susceptible to various modifications and alternative constructions, certain illustrated embodiments thereof are shown in the drawings and have been described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of terms "a" and "an" and "the" and similar referents in the context of describing disclosed embodiments (especially in the context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under the control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more individual non-transitory storage media of multiple non-transitory computer-readable storage media lack all of the code while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure, and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, the terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still cooperate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transforms that electronic data into other electronic data that may be stored in registers and/or memory. As a non-limiting example, a "processor" may be a network device. A "computing platform" may comprise one or more processors. As used herein, "software" processes may include, for example, software and/or hardware entities that perform work over time, such as tasks, threads, and intelligent agents. Also, each process may refer to multiple processes for continuously or intermittently carrying out instructions in sequence or in parallel. In at least one embodiment, the terms "system" and "method" are used herein interchangeably as far as the system may embody one or more methods and methods may be considered a system.

In the present document, references may be made to obtaining, acquiring, receiving, or inputting analog or digital data into a subsystem, computer system, or computer-implemented machine. In at least one embodiment, the process of obtaining, acquiring, receiving, or inputting analog and digital data can be accomplished in a variety of ways such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface or an inter-process communication mechanism.

Although descriptions herein set forth example embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A communication device comprising:
a timing and synchronization circuit to generate a victim signal; and
a jitter injection generator coupled to the timing and synchronization circuit, wherein the jitter injection generator comprises:
a noise source circuit to generate a signal;
a first register to store a first value;
a second register to store a second value;
a multiplexer coupled to the first register and the second register; and
a summation block coupled to an output of the multiplexer, the summation block to receive the victim signal and an output signal from the multiplexer to obtain a new victim signal, wherein the multiplexer is to select either the first value or the second value based on the signal from the noise source circuit, wherein the new victim signal represents the victim signal with injected jitter.

2. The communication device of claim 1, wherein the noise source circuit is a numerically controlled oscillator (NCO), wherein the timing and synchronization circuit is to provide a clock signal to the NCO.

3. The communication device of claim 2, wherein the NCO comprises:
a third register to store an initial value;
a fourth register to store a current value; and
an adder coupled to the third register and the fourth register, the adder to add the initial value to the current value to obtain a new current value to be stored in the fourth register, wherein the NCO is to provide a most significant bit of the current value, stored in the fourth register, in the signal after each clock cycle of the clock signal.

4. The communication device of claim 1, wherein the noise source circuit is a random noise generator that generates a pseudorandom binary sequence (PRBS) in the signal.

5. The communication device of claim 4, wherein the random noise generator comprises:
a third register; and
a set of exclusive OR (XOR) gates coupled to the third register.

6. The communication device of claim 1, wherein the timing and synchronization circuit is a phase-locked loop (PLL) circuit.

7. The communication device of claim 1, wherein the timing and synchronization circuit is a Clock and Data Recovery (CDR) circuit.

8. The communication device of claim 1, further comprising:
a spectrum hardware engine coupled to the timing and synchronization circuit, the spectrum hardware engine to receive a second signal comprising an input sequence of time-domain data from the timing and synchronization circuit and transform the time-domain data into frequency-domain data, wherein the spectrum hardware engine comprises:
a third register to store a third value representing a first previous output of the spectrum hardware engine;
a fourth register to store a fourth value representing a second previous output of the spectrum hardware engine;
a first multiplier to calculate a first product of the fourth value and a fixed value;
a second multiplier to calculate a second product of the third value and a pre-computed coefficient by a computing device operatively coupled to the communication device; and a second summation block to sum a fifth value, representing a current input of the time-domain data, the first product, and the second product, to obtain a current output, wherein the spectrum hardware engine is to send the current output to the computing device, the computing device to detect and estimate phase noise present in the second signal using at least the first previous output and the second previous output.

9. The communication device of claim 8, wherein a jitter transfer function is based on the injected jitter and the phase noise present in the second signal.

10. A system comprising:
a computing device; and
a communication device, the communication device comprising:
    a timing and synchronization circuit to generate a victim signal;
    a noise source circuit to generate a signal; and
    a jitter injection generator coupled to the noise source circuit and the timing and synchronization circuit, wherein the jitter injection generator comprises:
    a first register to store a first value;
    a second register to store a second value;
    a multiplexer coupled to the first register and the second register; and
    a summation block coupled to an output of the multiplexer, the summation block to receive the victim signal and an output signal from the multiplexer to obtain a new victim signal, wherein the multiplexer is to select either the first value or the second value based on the signal from the noise source circuit, wherein the new victim signal represents the victim signal with injected jitter.

11. The system of claim 10, wherein the noise source circuit is a numerically controlled oscillator (NCO), wherein the timing and synchronization circuit is to provide a clock signal to the NCO.

12. The system of claim 11, wherein the NCO comprises:
a third register to store an initial value;
a fourth register to store a current value; and
an adder coupled to the third register and the fourth register, the adder to add the initial value to the current value to obtain a new current value to be stored in the fourth register, wherein the NCO is to provide a most significant bit of the current value, stored in the fourth register, in the signal after each clock cycle of the clock signal.

13. The system of claim 10, wherein the noise source circuit is a random noise generator that generates a pseudo-random binary sequence (PRBS) in the signal.

14. The system of claim 13, wherein the random noise generator comprises:
a third register; and
a set of exclusive OR (XOR) gates coupled to the third register.

15. The system of claim 10, wherein the timing and synchronization circuit is a phase-locked loop (PLL) circuit.

16. The system of claim 10, wherein the timing and synchronization circuit is a Clock and Data Recovery (CDR) circuit.

17. The system of claim 10, wherein the communication device further comprises:
a spectrum hardware engine coupled to the timing and synchronization circuit, the spectrum hardware engine to receive a second signal comprising an input sequence of time-domain data from the timing and synchronization circuit and transform the time-domain data into frequency-domain data, wherein the spectrum hardware engine comprises:
a third register to store a third value representing a first previous output of the spectrum hardware engine;
a fourth register to store a fourth value representing a second previous output of the spectrum hardware engine;
a first multiplier to calculate a first product of the fourth value and a fixed value;
a second multiplier to calculate a second product of the third value and a pre-computed coefficient by the computing device; and
a second summation block to sum a fifth value, representing a current input of the time-domain data, the first product, and the second product, to obtain a current output, wherein the spectrum hardware engine is to send the current output to the computing device, the computing device to detect and estimate phase noise present in the second signal using at least the first previous output and the second previous output.

18. The system of claim 17, wherein a jitter transfer function is based on the injected jitter and the phase noise present in the second signal.

19. A method comprising:
generating, using a timing and synchronization circuit of a communication device, a victim signal;
receiving, using a jitter injection generator, a first signal from a noise source circuit;
generating, using the jitter injection generator, a new victim signal representing the victim signal with injected jitter by:
    storing a first value in a first register of the jitter injection generator;
    storing a second value in a second register of the jitter injection generator;
    selecting either the first value or the second value based on the first signal from the noise source circuit;
    adding either the first value or the second value to the victim signal to obtain the new victim signal;
generating, using the timing and synchronization circuit, a second signal comprising an input sequence of time-domain data, the second signal being subject to the injected jitter;
transforming, using a spectrum hardware engine of the communication device, the time-domain data into frequency-domain data, by:
    calculating a first product of a fixed value and a second value, wherein the second value is stored in a second register of the spectrum hardware engine and represents a second previous output of the spectrum hardware engine;
    calculating a second product of a first value and a pre-computed coefficient computed by a computing device operatively coupled to the communication device, wherein the first value is stored in a first register of the spectrum hardware engine and represents a first previous output of the spectrum hardware engine;
    summing a third value, representing a current input of the time-domain data, the first product, and the second product, to obtain a current output; and
    sending the current output for the frequency-domain data to the computing device; and estimating, using the computing device, phase noise present in the second signal using at least the first previous output and the second previous output.

20. The method of claim 19, further comprising measuring a jitter transfer function using the injected jitter and the phase noise present in the second signal.

21. A system for high-speed network communication, the system comprising:

a processing unit; and a network interface coupled to the processing unit, wherein the network interface comprises a communication device comprising:

a timing and synchronization circuit to generate a victim signal; and a jitter injection generator coupled to the timing and synchronization circuit, wherein the jitter injection generator comprises:

a noise source circuit to generate a signal;

a first register to store a first value;

a second register to store a second value;

a multiplexer coupled to the first register and the second register; and a summation block coupled to an output of the multiplexer, the summation block to receive the victim signal and an output signal from the multiplexer to obtain a new victim signal, wherein the multiplexer is to select either the first value or the second value based on the signal from the noise source circuit, wherein the new victim signal represents the victim signal with injected jitter.

22. The system of claim 21, wherein the processing unit comprises at least one of a central processing unit (CPU), a graphics processing unit (GPU), a data processing unit (DPU), a network adapter, a network switch, or an NVLink switch.

\* \* \* \* \*